United States Patent
Fujikura

(10) Patent No.: US 11,600,704 B2
(45) Date of Patent: Mar. 7, 2023

(54) NITRIDE SEMICONDUCTOR LAMINATE, SEMICONDUCTOR DEVICE, METHOD OF MANUFACTURING NITRIDE SEMICONDUCTOR LAMINATE, METHOD OF MANUFACTURING NITRIDE SEMICONDUCTOR FREE-STANDING SUBSTRATE AND METHOD OF MANUFACTURING SEMICONDUCTOR DEVICE

(71) Applicant: SUMITOMO CHEMICAL COMPANY, LIMITED, Tokyo (JP)

(72) Inventor: Hajime Fujikura, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 297 days.

(21) Appl. No.: 16/621,605

(22) PCT Filed: Apr. 19, 2018

(86) PCT No.: PCT/JP2018/016130
§ 371 (c)(1),
(2) Date: Mar. 25, 2020

(87) PCT Pub. No.: WO2018/230150
PCT Pub. Date: Dec. 20, 2018

(65) Prior Publication Data
US 2020/0219983 A1    Jul. 9, 2020

(30) Foreign Application Priority Data

Jun. 15, 2017   (JP) .............................. JP2017-117658

(51) Int. Cl.
*H01L 29/36*   (2006.01)
*H01L 29/20*   (2006.01)
(Continued)

(52) U.S. Cl.
CPC ........ *H01L 29/2003* (2013.01); *C30B 25/186* (2013.01); *C30B 25/20* (2013.01);
(Continued)

(58) Field of Classification Search
CPC . H01L 21/0254; H01L 29/2003; H01L 33/32; H01L 21/02458; H01L 21/02389;
(Continued)

(56) References Cited

U.S. PATENT DOCUMENTS 7,098,484 B2 *   8/2006   Yamanaka ............... H01L 33/14
                                                                     257/97
2004/0200976 A1 *  10/2004   Yagi ........................ G01J 1/429
                                                                     250/372

(Continued)

FOREIGN PATENT DOCUMENTS

JP    2003-273398 A    9/2003
JP    2010-509177 A    3/2010
(Continued)

OTHER PUBLICATIONS

Okumura et al., "Growth diagram of N-face GaN (0001) grown at high rate by plasma-assisted molecular beam epitaxy," Applied Physics Letters, vol. 104, 2014, pp. 012111-1 to 012111-5.
(Continued)

*Primary Examiner* — Jaehwan Oh
(74) *Attorney, Agent, or Firm* — Foley & Lardner LLP

(57) ABSTRACT

A nitride semiconductor laminate includes: a substrate comprising a group III nitride semiconductor and including a surface and a reverse surface, the surface being formed from a nitrogen-polar surface, the reverse surface being formed from a group III element-polar surface and being provided on the reverse side from the surface; a protective layer provided at least on the reverse surface side of the substrate and having higher heat resistance than the reverse surface of
(Continued)

the substrate; and a semiconductor layer provided on the surface side of the substrate and comprising a group III nitride semiconductor. The concentration of O in the semiconductor layer is lower than $1 \times 10^{17}$ at/cm$^3$.

16 Claims, 10 Drawing Sheets

(51) Int. Cl.
*C30B 25/18* (2006.01)
*C30B 25/20* (2006.01)
*C30B 29/40* (2006.01)
*C30B 31/22* (2006.01)
*H01L 21/02* (2006.01)
*H01L 21/265* (2006.01)
*H01L 21/266* (2006.01)
*H01L 21/324* (2006.01)
*H01L 29/66* (2006.01)
*H01L 29/872* (2006.01)

(52) U.S. Cl.
CPC ............ *C30B 29/406* (2013.01); *C30B 31/22* (2013.01); *H01L 21/0254* (2013.01); *H01L 21/0262* (2013.01); *H01L 21/266* (2013.01); *H01L 21/26553* (2013.01); *H01L 21/3245* (2013.01); *H01L 29/36* (2013.01); *H01L 29/66143* (2013.01); *H01L 29/872* (2013.01)

(58) Field of Classification Search
CPC ............. H01L 29/452; H01L 21/28575; H01L 21/2654; H01L 21/3245; H01L 21/02241
See application file for complete search history.

(56) References Cited

U.S. PATENT DOCUMENTS

| | | | |
|---|---|---|---|
| 2006/0267035 A1* | 11/2006 | Yamanaka | ............ H01L 33/32 257/97 |
| 2008/0113496 A1 | 5/2008 | Keller et al. | |
| 2008/0258150 A1 | 10/2008 | McCarthy et al. | |
| 2010/0252864 A1 | 10/2010 | Kawasaki | |
| 2011/0278647 A1 | 11/2011 | Hashimoto et al. | |
| 2013/0011677 A1 | 1/2013 | Nambu et al. | |
| 2014/0264372 A1* | 9/2014 | Fujikane | ................. H01L 33/16 438/478 |
| 2015/0311062 A1* | 10/2015 | Lee | .................. H01L 21/02433 438/46 |
| 2016/0319460 A1* | 11/2016 | Tsukada | ............. H01L 21/0254 |
| 2018/0038010 A1* | 2/2018 | Mori | .................. H01L 21/0254 |
| 2018/0182882 A1* | 6/2018 | Hashimoto | ....... H01L 21/02631 |
| 2019/0157448 A1* | 5/2019 | Takashima | .......... H01L 21/3245 |

FOREIGN PATENT DOCUMENTS

| | | | |
|---|---|---|---|
| JP | 2010-245252 A | 10/2010 | |
| JP | 2010-245352 A | 10/2010 | |
| JP | 2011-243644 A | 12/2011 | |
| JP | 2012-089678 A | 5/2012 | |
| JP | 2013-177275 A | 9/2013 | |
| JP | 2015-046441 A | 3/2015 | |
| JP | 2015-106627 A | 6/2015 | |
| JP | 2016-062937 A | 4/2016 | |
| JP | 2016-128381 A | 7/2016 | |
| WO | WO-2012/053332 A1 | 4/2012 | |

OTHER PUBLICATIONS

Keller et al., "Influence of the substrate misorientation on the properties of N-polar GaN films grown by metal organic chemical vapor deposition," Journal of Applied Physics, vol. 102, 2007, pp. 083546-1 to 083546-6.

International Searching Authority, "International Search Report," issued in connection with International Patent Application No. PCT/JP2018/016130, dated Jul. 10, 2018.

International Searching Authority, "Written Opinion," issued in connection with International Patent Application No. PCT/JP2018/016130, dated Jul. 10, 2018.

International Preliminary Report on Patentability dated Dec. 17, 2019 for corresponding Application No. PCT/JP2018/016130.

* cited by examiner

NITRIDE SEMICONDUCTOR LAMINATE, SEMICONDUCTOR DEVICE, METHOD OF MANUFACTURING NITRIDE SEMICONDUCTOR LAMINATE, METHOD OF MANUFACTURING NITRIDE SEMICONDUCTOR FREE-STANDING SUBSTRATE AND METHOD OF MANUFACTURING SEMICONDUCTOR DEVICE

CROSS-REFERENCE TO RELATED APPLICATIONS

The present application claims priority under 37 U.S.C. § 371 to International Patent Application No. PCT/JP2018/016130, filed Apr. 19, 2018, which claims priority to and the benefit of Japanese Patent Application No. 2017-117658, filed on Jun. 15, 2017. The contents of these applications are hereby incorporated by reference in their entireties.

TECHNICAL FIELD

The present invention relates to a nitride semiconductor laminate, semiconductor device, nitride semiconductor laminate manufacturing method, nitride semiconductor free-standing substrate manufacturing method, and semiconductor device manufacturing method.

BACKGROUND ART

In the manufacture of a nitride semiconductor laminate, a nitride semiconductor free-standing substrate, a semiconductor device, etc., a semiconductor layer including a group III nitride semiconductor may be epitaxially grown on a predetermined substrate by vapor phase epitaxy (e.g. Non-Patent Literature 1).

Related Art Literature
Non-Patent Literature
Non-Patent Literature 1: S. Keller et al.: JOURNAL OF APPLIED PHYSICS Vol. 102, 083546 (2007)

SUMMARY OF INVENTION

Problem to be Solved by Invention

An objective of the present invention is to provide a technique by which a nitride semiconductor laminate, a nitride semiconductor free-standing substrate, and a semiconductor device can each be manufactured with high purity.

Means for Solving Problem

In an aspect of the present invention, provided is a nitride semiconductor laminate and related techniques, the nitride semiconductor laminate including:
a substrate comprising a group III nitride semiconductor and including a surface and a reverse surface, the surface being formed from a nitrogen-polar surface, the reverse surface being formed from a group III element-polar surface, the reverse surface being provided on the reverse side from the surface;
a protective layer provided at least on the reverse surface side of the substrate and having higher heat resistance than the reverse surface of the substrate; and
a semiconductor layer provided on the surface side of the substrate and comprising a group III nitride semiconductor, wherein concentration of O in the semiconductor layer is lower than $1\times10^{17}$ at/cm$^3$.

Effect of Invention

According to the present invention, a nitride semiconductor laminate, a nitride semiconductor free-standing substrate, and a semiconductor device can each be manufactured with high purity.

DETAILED DESCRIPTION OF INVENTION

Inventor's Finding

Figure 1:
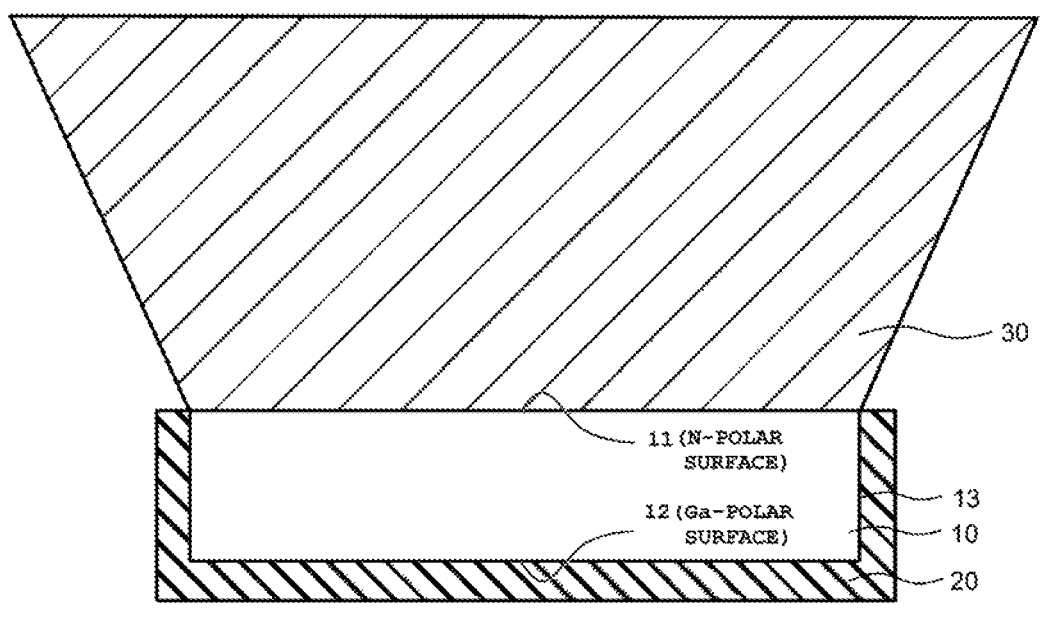
FIG. 1 is a cross-sectional diagram illustrating a nitride semiconductor laminate in a first embodiment of the present invention.

In the manufacture of a nitride semiconductor laminate, a nitride semiconductor free-standing substrate, or a semiconductor device, a semiconductor layer may be formed on a surface of a substrate including a group III nitride semiconductor, the surface being formed from a nitrogen (N)-polar surface. In cases where a semiconductor layer is epitaxially grown on an N-polar surface, the semiconductor layer tends to be contaminated by impurities such as oxygen (O) more easily than in cases where a semiconductor layer is epitaxially grown on a group III element-polar surface. Accordingly, in the state of the art, a semiconductor layer is grown at a growth temperature of 1200° C. or more(higher), as in Non-Patent Literature 1, for example.

However, when a semiconductor layer is grown on a substrate surface formed from an N-polar surface at such high growth temperatures, phenomena such as the following may occur.

When a semiconductor layer is grown at a high growth temperature, a substrate reverse surface formed from a group III element-polar surface undergoes thermal decomposition and the group III element intensely evaporates from the reverse surface (at 1 μm/hr or more, for example). When the group III element evaporates from the substrate reverse surface, vapor of the highly concentrated group III element reaches the substrate surface and droplets of the group III element adheres to the substrate surface. Adhesion of such group III element droplets to the substrate surface constitutes hindrance to the growth of the semiconductor layer on the substrate. As a result, at least a portion of the surface of the semiconductor layer may be roughened.

Moreover, when the group III element evaporates from the substrate reverse surface, impurities (e.g. silicon (Si)) contained in the substrate reverse surface may reach the substrate surface and the impurities may contaminate the semiconductor layer. This makes it difficult to grow a semiconductor layer with high purity.

Furthermore, when a semiconductor layer is grown at a high growth temperature, a member constituting a reaction vessel in a vapor phase epitaxy apparatus and containing quartz or boron (B) may become the cause of Si, O, B, or the like, contaminating the semiconductor layer. This also makes it difficult to grow a semiconductor layer with high purity.

As described above, because of the aforementioned phenomena, it is difficult to manufacture a nitride semiconductor laminate, a nitride semiconductor free-standing substrate, or a semiconductor device with high purity when the manufacture involves growth of a semiconductor layer on a substrate surface formed from an N-polar surface at a high growth temperature.

The aforementioned novel problems found by the inventors of the present invention forms the ground of the present invention.

First Embodiment of Present Invention

A first embodiment of the present invention will be described below with reference to the appended drawings.

1. Nitride Semiconductor Laminate

First, using FIG. 1, a nitride semiconductor laminate (will be also called "stack" below) 1 in this embodiment will be described. FIG. 1 is a cross-sectional diagram illustrating the nitride semiconductor laminate in this embodiment.

As illustrated in FIG. 1, the laminate 1 in this embodiment may, for example, be configured as an ingot (intermediate material) involved in the manufacture of a nitride semiconductor free-standing substrate (will be also called "free-standing substrate" below) 2 (described later). Specifically, the laminate 1 may include a substrate (base substrate) 10, a protective layer (thermal decomposition suppressing layer) 20, and a semiconductor layer (epitaxial growth layer) 30, for example.

Substrate

The substrate 10 is configured so as to function as a base substrate (seed crystal substrate) on which to homoepitaxially grow the semiconductor layer 30 (described later). Specifically, the substrate 10 is formed from a nitride semiconductor free-standing substrate including (comprising) a group III nitride semiconductor, and in this embodiment, may be a gallium nitride (GaN) free-standing substrate, for example. In the description below, the upper surface (upper main surface or first main surface) of the substrate 10 is defined as a "surface 11", the lower surface (lower main surface or second main surface) of the substrate 10 on the reverse side from the upper surface is defined as a "reverse surface 12" (back surface), and a surface that connects the upper and lower surfaces of the substrate 10 and that is perpendicular to these surfaces is defined as a "side surface 13".

In this embodiment, the surface 11 of the substrate 10 is a (000-1) surface (-c face), i.e. an N-polar surface. The surface 11 of the substrate 10 may be a mirror surface, for example. In other words, the surface 11 of the substrate is a so-called "epi-ready" surface on which the semiconductor layer 30 can be epitaxially grown.

Specifically, the root mean square (RMS) of the surface 11 of the substrate 10 may be smaller than or equal to 10 nm, preferably smaller than or equal to 1 nm, for example. The "RMS" as referred to herein means an RMS measured by atomic force microscopy (AFM) within a 20 μm-square area.

A GaN crystal constituting the substrate 10 may have a predetermined off angle relative to a surface 102 of a base substrate 100. An "off angle" refers to an angle formed between a direction normal to the surface 11 of the substrate 10 and the direction of a principal axis (a direction normal to the closest low-index face to the main surface) defining the substrate 10. Specifically, the off angle of the substrate 10 may be 0° or more and 5° or less, for example.

A dislocation density (mean dislocation density) in the surface 11 of the substrate 10 may be smaller than or equal to $1\times10^7$ cm$^{-2}$, preferably smaller than or equal to $1\times10^5$ am$^{-2}$, for example. When the dislocation density in the surface 11 of the substrate 10 exceeds $1\times10^7$ cm$^{-2}$, the dislocation density of the semiconductor layer 30 formed on the substrate 10 becomes high, and it may not be possible to obtain a free-standing substrate 2 with satisfactory crystal quality from the semiconductor layer 30. In contrast, by setting the dislocation density in the surface 11 of the substrate 10 to smaller than or equal to $1\times10^7$ cm$^{-2}$, the dislocation density of the semiconductor layer 30 formed on the substrate 10 is made low, and a free-standing substrate 2 with satisfactory crystal quality can be obtained from the semiconductor layer 30. Moreover, by setting the dislocation density in the surface 11 of the substrate 10 tosmaller than or equal to $1\times10^5$ cm$^{-2}$, a free-standing substrate 2 with satisfactory crystal quality can be stably obtained from the semiconductor layer 30. It is preferable that the dislocation density in the surface of the substrate 10 be as low as possible and there are no limitations in terms of the lower limit value of the dislocation density; however, according to the current state of the art, the lower limit value of the dislocation density in the surface 11 of the substrate 10 would be around $1\times510^2$ cm$^{-2}$, for example.

In this embodiment, the reverse surface 12 of the substrate 10 is a (0001) surface (+c face), i.e. a group III element-polar surface (a Ga-polar surface in this example). The reverse surface 12 of the substrate 10 may be a rough surface having random convexities and concavities, which is called a "lapped surface", for example. In other words, the surface roughness of the reverse surface 12 of the substrate 10 is larger than the surface roughness of the surface 11 of the substrate 10. Specifically, the RMS of the reverse surface 12 of the substrate 10 may be 0.5 μm or more and 5 μm or less, for example. Note that the reverse surface 12 of the substrate 10 may also be an epi-ready surface, similarly to the surface 11.

The thickness of the substrate 10 is dependent on the diameter of the substrate 10, and is 300 μm or more and 2 mm or less, for example. Typically, the thickness of the substrate 10 may be set to 300-600 μm when the diameter of the substrate 10 is 2 inches (50.8 mm), the thickness of the substrate 10 may be set to 600-1200 μm when the diameter of the substrate 10 is 4 inches (100 mm), and the thickness of the substrate 10 may be set to 1000-2000 μm when the diameter of the substrate 10 is 6 inches (150 mm). In this example, the diameter of the substrate 10 is 2 inches and the thickness of the substrate 10 is 400 μm, for example.

Protective Layer

The protective layer 20 is provided at least on the reverse surface 12 side of the substrate 10 and includes (comprises) a material having higher heat resistance than the reverse surface 12 of the substrate 10. The "heat resistance" as referred to herein means resistance against thermal decomposition (sublimation) when heated to a predetermined temperature. In this embodiment, the thermal decomposition rate of the protective layer 20 is lower than the thermal decomposition rate of the reverse surface 12 of the substrate 10, when heated at a temperature of 1250° C. or higher, for example. Provision of such a protective layer 20 at least on the reverse surface 12 side of the substrate 10 makes it possible to suppress thermal decomposition of the reverse surface 12 of the substrate 10 and suppress generation of Ga vapor from the reverse surface 12 of the substrate 10 during a semiconductor layer growth step S160 (described later).

The protective layer 20 may include a material which, in addition to the aforementioned heat resistance, also has higher corrosion resistance than the substrate 10 against an atmosphere in the semiconductor layer growth step S160 (described later). The "atmosphere in the semiconductor layer growth step S160" as referred to herein means, in particular, an atmosphere containing hydrogen (H), i.e. an atmosphere containing hydrogen ($H_2$) gas serving as a carrier gas, ammonia ($NH_3$) gas serving as a nitriding agent, etc. Moreover, the "corrosion resistance . . . against an atmosphere in the semiconductor layer growth step S160" as referred to herein means resistance against being etched (corroded) by the atmosphere. That is, the protective layer 20 may have a lower etching rate under the atmosphere in the semiconductor layer growth step S160 than that of the substrate 10. Accordingly, the semiconductor layer 30 can be grown stably on the substrate 10 in the semiconductor layer growth step S160.

In this embodiment, the protective layer 20 is also provided on the side surface 13 side of the substrate 10. Accordingly, thermal decomposition of the side surface 13 of the substrate 10 can be suppressed and generation of Ga vapor from the side surface 13 of the substrate 10 can be suppressed in the semiconductor layer growth step S160 (described later).

In FIG. 1 and other relevant drawings, the side surface 13 of the substrate 10 is schematically depicted as being perpendicular to both the surface 11 and the reverse surface 12; however, the side surface 13 of the substrate 10 may be constituted by inclined surfaces obtained by beveling, or constituted by a combination of a plurality of inclined surfaces, for example.

Examples of a specific material constituting the protective layer 20 include aluminum nitride (AlN), aluminum oxide ($Al_2O_3$), and boron nitride (BN). Using such materials allows the protective layer 20 to have higher heat resistance and higher corrosion resistance than the substrate 10. In this example, the material constituting the protective layer 20 may be AlN, for example.

The protective layer 20 is amorphous or polycrystalline, for example. In the case where the protective layer 20 is AlN, for example, the protective layer is amorphous when the deposition temperature is lower than or equal to 600° C., whereas when the deposition temperature is 600° C. or more and 800° C. or less, the protective layer 20 is polycrystalline.

In this embodiment, since the protective layer 20 is amorphous or polycrystalline, the crystal orientation in the protective layer 20 is random, i.e. the cleavage direction is random. Thereby, generation of a crack in a specific cleavage direction can be suppressed in the protective layer 20. Moreover, even when internal stress occurs within the protective layer 20, since cleavage is low, the internal stress can be dispersed isotropically. As these results, the protective layer 20 can be made less prone to cracks.

The protective layer 20 may be monocrystalline. In other words, the protective layer 20 may be epitaxially grown on the reverse surface 12 side of the substrate 10. In the case where the protective layer 20 is AlN, for example, the protective layer 20 is monocrystalline when the deposition temperature is 800° C. or more. Accordingly, adhesion between the protective layer 20 and the substrate 10 can be enhanced, and thermal decomposition of the reverse surface 12 of the substrate 10 can be reliably avoided.

In this embodiment, the thickness of the protective layer 20 is 20 nm or more and 1000 nm or less, preferably 50 nm or more and 800 nm or less, for example. When the thickness of the protective layer 20 is smaller than 20 nm, the performance of the protective layer 20 in terms of covering the reverse surface 12 and the side surface 13 of the substrate 10 declines. This may result in at least one of the reverse surface 12 and the side surface 13 of the substrate 10 being thermally decomposed via a portion lacking coverage by the protective layer 20 when the temperature of the substrate 10 is raised to 1250° C. or more during the semiconductor layer growth step S160 (described later). In contrast, by setting the thickness of the protective layer 20 to larger than or equal to 20 nm, it is possible to allow the protective layer 20 to cover the reverse surface 12 and the side surface 13 of the substrate 10 while suppressing the generation of a portion lacking coverage. Accordingly, even when the temperature of the substrate 10 is raised to 1250° C. or more during the semiconductor layer growth step S160, thermal decomposition of the reverse surface 12 and the side surface 13 of the substrate 10 via the protective layer 20 can be limited. Moreover, by setting the thickness of the protective layer 20 to larger than or equal to 50 nm, thermal decomposition of the reverse surface 12 and the side surface 13 of the substrate 10 can be stably suppressed. Meanwhile, when the thickness of the protective layer 20 is larger than 1000 nm, thermal stress occurs due to the difference between the protective layer 20 and the substrate 10 in the coefficient of linear thermal expansion. Even when the protective layer 20 is amorphous or polycrystalline, a crack may occur in the substrate 10 or the protective layer 20. In contrast, by setting the thickness of the protective layer 20 to smaller than or equal to 1000 nm, occurrence of excessive thermal stress between the protective layer 20 and the substrate 10 can be suppressed. Accordingly, it is possible to suppress the occurrence of a crack in the substrate 10 or the protective layer 20 when the protective layer 20 is amorphous or polycrystalline. Moreover, by setting the thickness of the protective layer 20 to smaller than or equal to 800 nm, occurrence of a crack in the substrate 10 or the protective layer 20 due to thermal stress can be reliably suppressed. When the protective layer 20 is monocrystalline, the thickness of the protective layer 20 being larger than 800 nm may result in the occurrence of a crack, whereas setting the thickness of the protective layer 20 to smaller than or equal to 500 nm makes it possible to reliably suppress the occurrence of a crack.

The thickness of the protective layer 20 provided on the reverse surface 12 side of the substrate 10 and the thickness of the protective layer 20 provided on the side surface 13 side of the substrate 10 may be made different in accordance with the difference between the reverse surface 12 and the side surface 13 of the substrate 10 in the thermal decomposition rate. For example, when the thermal decomposition rate of the reverse surface 12 of the substrate 10 is higher than the thermal decomposition rate of the side surface 13 thereof, the thickness of the protective layer 20 provided on the reverse surface 12 side of the substrate 10 may be made larger than the thickness of the protective layer 20 provided on the side surface 13 side of the substrate 10. In this way, the reverse surface 12 of the substrate 10 having a higher thermal decomposition rate can be made less prone to thermal decomposition. Meanwhile, when the thermal decomposition rate of the side surface 13 of the substrate is higher than the thermal decomposition rate of the reverse surface 12 thereof, the thickness of the protective layer 20 provided on the side surface 13 side of the substrate 10 may be made larger than the thickness of the protective layer 20 provided on the reverse surface 12 side of the substrate 10. In this way, the side surface 13 of the substrate 10 having a higher thermal decomposition rate can be made less prone to thermal decomposition.

Semiconductor Layer

The semiconductor layer 30 is provided on the surface 11 side of the substrate 10 and is configured such that the free-standing substrates 2 (described later) can be obtained as a result of the semiconductor layer 30 being cut with a predetermined thickness. In this embodiment, the semiconductor layer 30 includes (comprises) a group III nitride semiconductor, and may specifically include GaN, for example, similarly to the substrate 10. The semiconductor layer 30 is provided directly on (in contact with) the surface 11 of the substrate 10 and is formed as a monocrystal by being homoepitaxially grown on the surface 11 of the substrate 10. The surface of the semiconductor layer 30 is a (000-1) surface (-c face), i.e. an N-polar surface, similarly to the surface 11 of the substrate 10.

In this embodiment, the semiconductor layer 30 is grown on the surface 11 of the substrate 10 by an N-polar surface, and thereby is provided such that the semiconductor layer 30 expands so as to have a larger diameter than the substrate 10 as the semiconductor layer 30 grows away from the surface 11 of the substrate 10 in a perpendicular direction. In other words, the semiconductor layer 30 has the shape of an inverted truncated cone. As a result, free-standing substrates 2 having a larger diameter than the substrate 10 can be obtained from the semiconductor layer 30.

In this embodiment, since generation of Ga vapor from at least the reverse surface 12 side of the substrate 10 is suppressed by the protective layer 20, the surface of the semiconductor layer 30 can be made to be smooth. Specifically, the RMS of the surface of the semiconductor layer 30 can be equivalent to that of the surface 11 of the substrate 10, for example, and be smaller than or equal to 10 nm, preferably smaller than or equal to 1 nm, for example.

The dislocation density in the surface of the semiconductor layer 30 may be equivalent to the dislocation density in the surface 11 of the substrate 10 and be smaller than or equal to $1\times10^{7}/cm^{2}$, for example.

In this embodiment, by the manufacturing method (described later), a high-temperature bake step is carried out, in which the surfaces of members constituting at least a high-temperature reaction region 201a of a reaction chamber 201 are purified and modified, and thereafter the semiconductor layer 30 is grown at a growth temperature of higher than or equal to 1250° C. so as to suppress contamination due to impurities. Thus, the semiconductor layer 30 is formed as a crystal layer having extremely high purity.

Specifically, the concentration of oxygen (O) in the semiconductor layer 30 may be lower than $1\times10^{17}$ at/cm$^3$, preferably lower than $1\times10^{16}$ at/cm$^3$, more preferably lower than $5\times10^{15}$ at/cm$^3$, for example. Accordingly, the free electron concentration in the semiconductor layer 30 can be easily controlled by the total concentration of Si and germanium (Ge) as n-type impurities (donors), and the free electron concentration in the semiconductor layer 30 can be made equivalent to the total concentration of Si and Ge.

The concentration of carbon (C) in the semiconductor layer 30 may be lower than $1\times10^{17}$ at/cm$^3$, preferably lower than $1\times10^{16}$ at/cm$^3$, more preferably lower than $5\times10^{15}$ at/cm$^3$, for example. Making the concentration of C compensating the n-type impurities in the semiconductor layer 30 low makes it possible to easily control the free electron concentration in the semiconductor layer 30 by the concentration of the n-type impurities.

In this embodiment, the concentration of each of Si and Ge in the semiconductor layer 30 may be lower than $1\times10^{17}$ at/cm$^3$, preferably lower than $1\times10^{16}$ at/cm$^3$, more preferably lower than $5\times10^{15}$ at/cm$^3$, for example. Accordingly, the free electron concentration in the semiconductor layer 30 can be made to be lower than a predetermined value and the insulation properties of the semiconductor layer 30 can be made to be high. As a result, the free-standing substrates 2 obtained from the semiconductor layer 30 can be formed as semi-insulating substrates. Specifically, the electrical resistivity of the free-standing substrates 2 under the temperature condition of 20° C. or more and 200° C. or less can be made to be higher than or equal to $1\times10^{6}$ Ω·cm.

The concentration of each of boron (B) and iron (Fe) in the semiconductor layer 30 may be lower than $1\times10^{15}$ at/cm$^3$, for example. In should be noted that these impurity concentrations are all below the measurement limit (lower limit of detection) of currently available rational means for analysis, such as secondary ion mass spectrometry (SIMS). It is currently difficult to even present the specific concentrations of the impurities included in the crystal.

The concentrations of impurities in the semiconductor layer 30 other than the aforementioned impurities are also low. Specifically, the concentrations of all of arsenic (As), chlorine (Cl), phosphorus (P), fluorine (F), sodium (Na), potassium (K), tin (Sn), titanium (Ti), manganese (Mn), chromium (Cr), molybdenum (Mo), tungsten (W), and nickel (Ni), for example, are below the lower limit of detection of SIMS measurement.

The current lower limit of detection of SIMS measurement for each of the elements above is as follows.

As: $5\times10^{12}$ at/cm$^3$,
Cl: $1\times10^{14}$ at/cm$^3$,
P: $2\times10^{15}$ at/cm$^3$,
F: $4\times10^{13}$ at/cm$^3$,
Na: $5\times10^{11}$ at/cm$^3$,
K: $2\times10^{12}$ at/cm$^3$,
Sn: $1\times10^{13}$ at/cm$^3$,
Ti: $1\times10^{12}$ at/cm$^3$, Mn: $5\times10^{12}$ at/cm$^3$,
Cr: $7\times10^{13}$ at/cm$^3$,
Mo: $1\times10^{15}$ at/cm$^3$,
W: $3\times10^{16}$ at/cm$^3$,
Ni: $1\times10^{14}$ at/cm$^3$.

In this embodiment, since stable growth of the semiconductor layer 30 over a long time is made possible by virtue of the protective layer 20, the thickness of the semiconductor layer 30 can be made large (thick).

Specifically, the thickness of the semiconductor layer 30 may be made to be larger than 100 µm, preferably larger than or equal to 1000 µm, for example.

Figure 2:
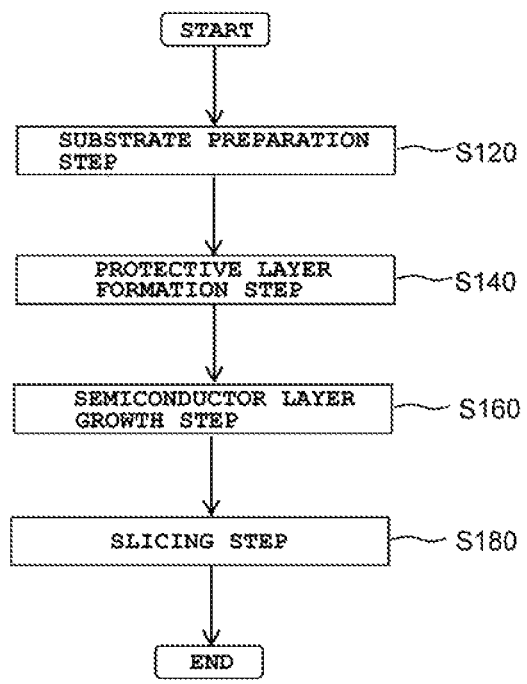
FIG. 2 is a flowchart illustrating a nitride semiconductor laminate manufacturing method or nitride semiconductor free-standing substrate manufacturing method in the first embodiment of the present invention.
Figure 3A:
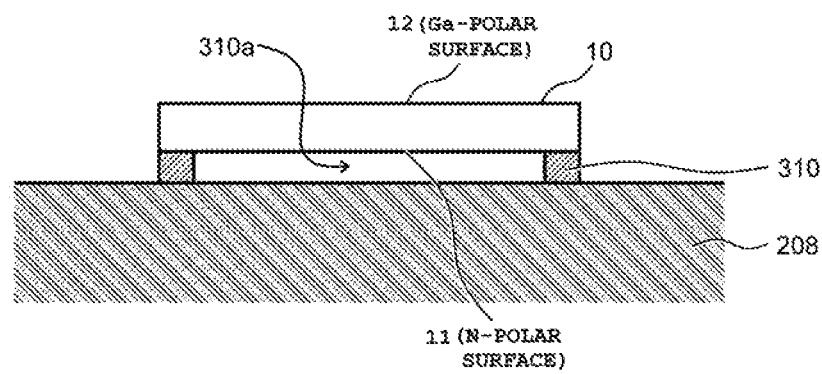
FIGS. 3A and 3B are cross-sectional diagrams illustrating states in which a substrate is placed in a protective layer formation step in the first embodiment.
Figure 4:
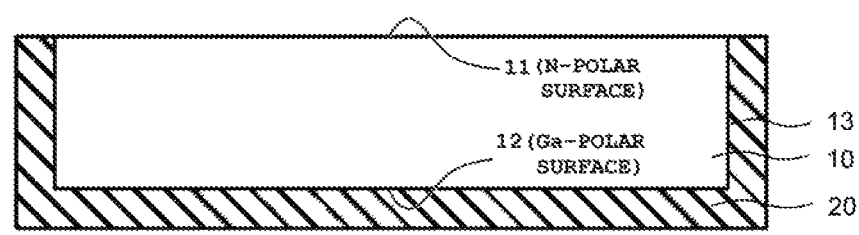
FIG. 4 is a cross-sectional diagram illustrating the substrate after the protective layer formation step.
Figure 5:
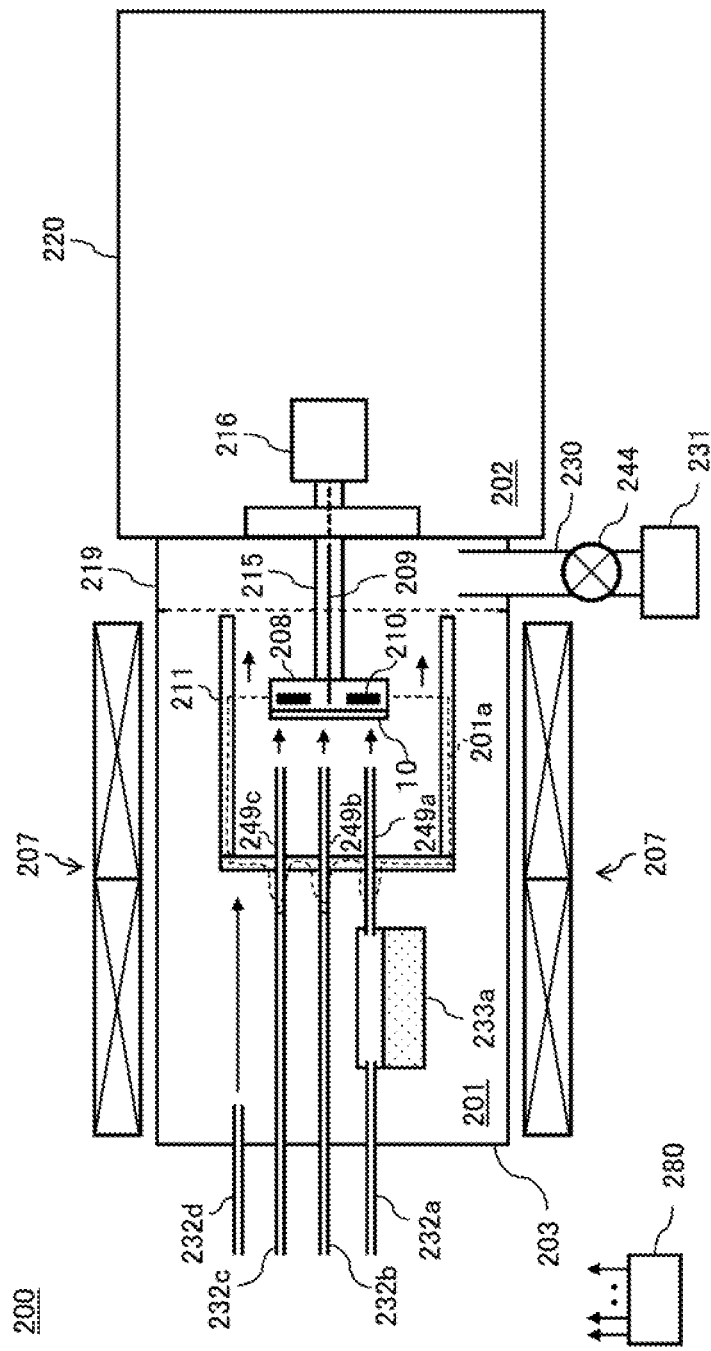
FIG. 5 is a schematic structural diagram of a vapor phase epitaxy apparatus and illustrates a state in which a crystal growth step is being performed in a reaction vessel.
Figure 6:
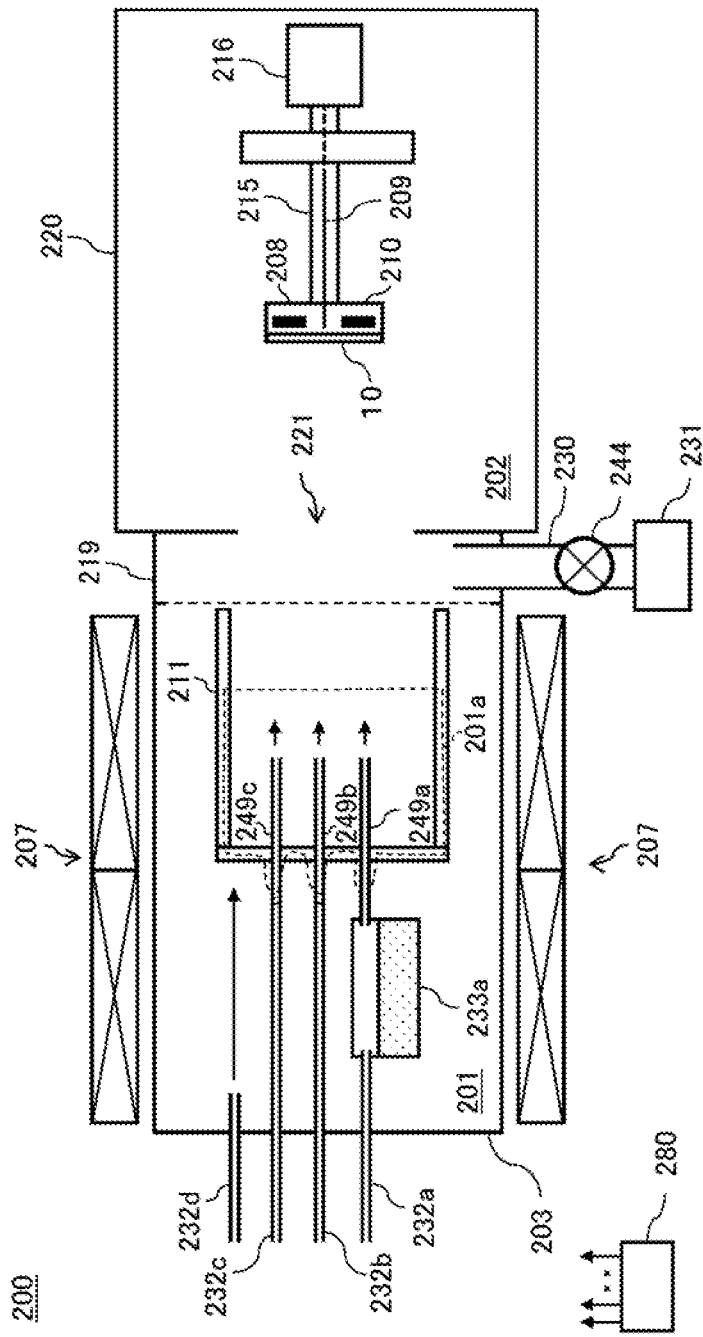
FIG. 6 is a schematic structural diagram of the vapor phase epitaxy apparatus and illustrates a state in which an opening of the reaction vessel is open.
Figure 7:
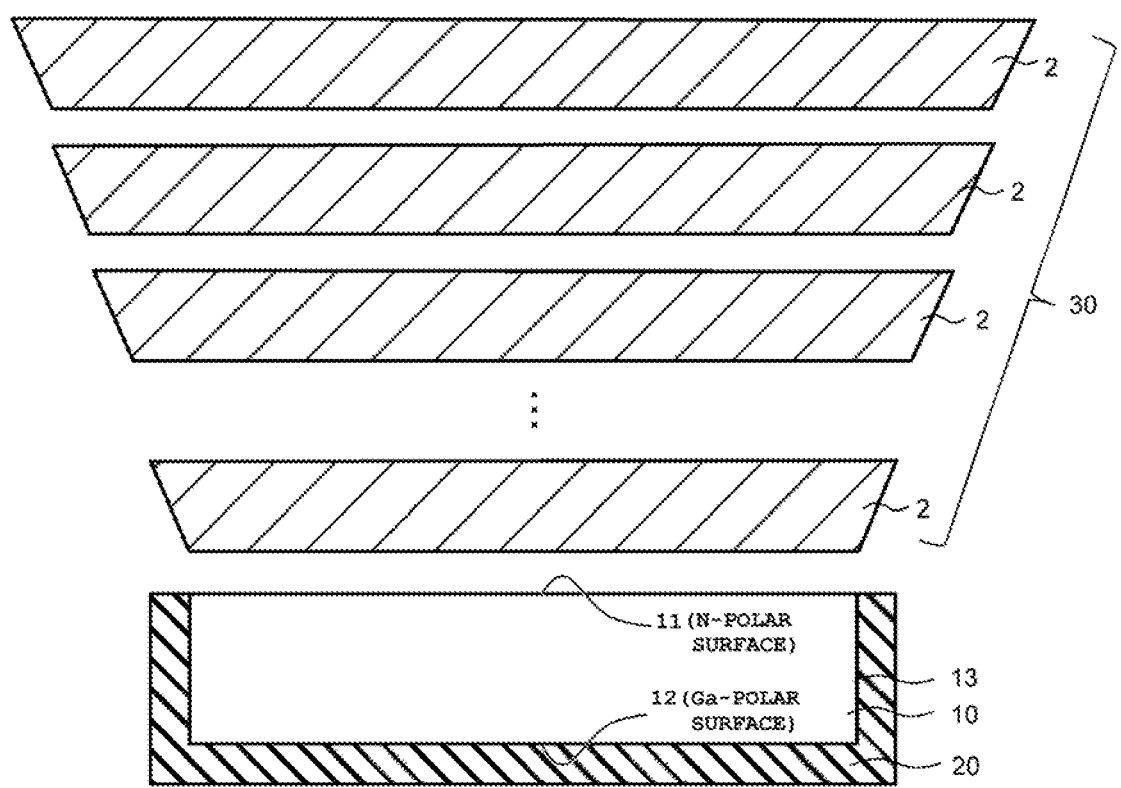
FIG. 7 is a cross-sectional diagram illustrating a slicing step.

2. Nitride Semiconductor Laminate Manufacturing Method and Nitride Semiconductor Free-Standing Substrate Manufacturing Method Next, the nitride semiconductor laminate manufacturing method and the nitride semiconductor free-standing substrate manufacturing method in this embodiment will be described using FIGS. 1 to 6. FIG. 2 is a flowchart illustrating the nitride semiconductor laminate manufacturing method or the nitride semiconductor free-standing substrate manufacturing method in this embodiment. "Step" is abbreviated as "S". FIGS. 3 (a) and (b) are cross-sectional diagrams illustrating states in which the substrate is placed in the protective layer formation step in this embodiment. FIG. 4 is a cross-sectional diagram illustrating the substrate after the protective layer formation step. FIG. 5 is a schematic structural diagram of the vapor phase epitaxy apparatus and illustrates a state in which a crystal growth step is being performed in the reaction vessel. FIG. 6 is a schematic structural diagram of the vapor phase epitaxy apparatus and illustrates a state in which an opening of the reaction vessel is open. FIG. 7 is a cross-sectional diagram illustrating a slicing step.

In this embodiment, described will be an example in which S120 to S180 indicated below are carried out to manufacture the laminate 1 and the nitride semiconductor free-standing substrate 2.

S120: Substrate Preparation Step

First, the substrate 10 including a group III nitride semiconductor is prepared. Specifically, a GaN free-standing substrate may be prepared as the substrate 10, for example. At this time, the surface 11 of the substrate 10 is set to be the N-polar surface and the reverse surface 12 of the substrate 10 is set to be the Ga-polar surface.

S140: Protective Layer Formation Step

Next, the protective layer 20 having higher heat resistance than the reverse surface 12 of the substrate 10 is formed at least on the reverse surface 12 side of the substrate 10. In this embodiment, the protective layer 20 may be formed not only the reverse surface 12 side of the substrate 10 but also on the side surface 13 side of the substrate 10, for example.

The protective layer 20 may be formed by, for example, sputtering, hydride vapor phase epitaxy (HVPE) (described later), metal organic vapor phase epitaxy (MOVPE), or the like.

If, in the protective layer formation step S140, the substrate 10 is placed on a susceptor in such a way that the surface 11 of the substrate 10 makes contact with a surface of the susceptor, the surface 11 of the substrate 10 may be damaged. If the surface 11 of the substrate 10 is damaged, a defect may be caused in the semiconductor layer 30 in the semiconductor layer growth step S160 (described later).

To cope with this, in this embodiment, as illustrated in FIG. 3 (a), for example, a ring-shaped spacer 310 is interposed between the surface 11 of the substrate 10 and the susceptor 208 so as to encompass the periphery of the surface 11 of the substrate 10, and the substrate 10 is placed on a susceptor 208 such that the surface 11 of the substrate 10 opposes the surface of the susceptor 208. In this way, a void 310a can be formed between the surface 11 of the substrate 10 and the susceptor 208. As a result, contact between the surface 11 of the substrate 10 and the susceptor 208 can be limited and damage to the surface 11 of the substrate 10 can be suppressed. Further, as a result of the ring-shaped spacer 310 being provided so as to encompass the periphery of the surface 11 of the substrate 10, supply of film deposition gas to the surface 11 of the substrate 10 can be prevented and formation of the protective layer 20 on the surface 11 side of the substrate 10 in this step can be suppressed. In this way, the surface 11 of the substrate 10 can be protected using the ring-shaped spacer 310. It is preferred that the ring-shaped spacer 310 have an equivalent outer diameter to the outer diameter of the substrate 10 and that the ring-shaped spacer 310 have an inner diameter that is smaller than the outer diameter of the substrate 10 by 1-10 mm. In other words, it is preferred that the width of the ring-shaped spacer 310 in the radial direction of the substrate 10 be around 0.5-5.0 mm. The height (thickness) of the ring-shaped spacer 310 is, preferably, around 0.5-2 mm.

Figure 3B:
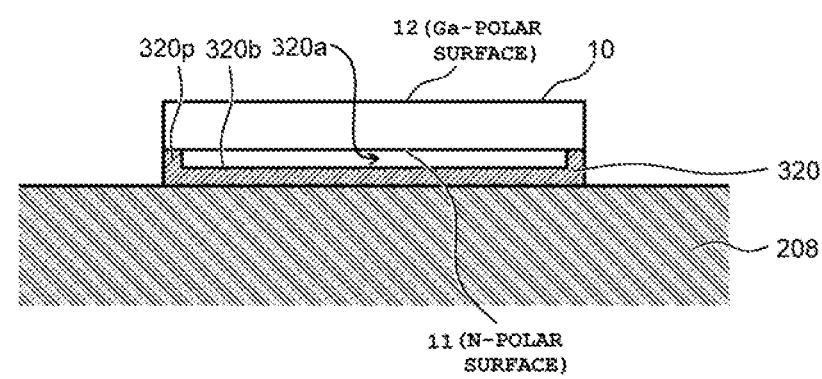

Alternatively, as illustrated in FIG. 3(b), in this embodiment, a plate-shaped spacer 320 having a spacer bottom portion 320b and a spacer protruding portion 320p may be used, for example. The spacer bottom portion 320b is formed into a disc shape. The spacer protruding portion 320p is provided so as to protrude from the spacer bottom portion 320b and encompass the periphery of the surface of the spacer bottom portion 320b. When the plate-shaped spacer 320 is used to place the substrate 10, the spacer protruding portion 320p is abutted against the periphery of the surface 11 of the substrate 10, and the surface 11 of the substrate 10 opposes the spacer bottom portion 320b. Then the substrate is placed on the susceptor 208 with the plate-shaped spacer 320 being interposed between the surface 11 of the substrate 10 and the susceptor 208. Accordingly, a void 320a can be formed between the surface 11 of the substrate 10 and the spacer bottom portion 320b. As a result, as in the case with the ring-shaped spacer 310, the surface 11 of the substrate 10 can be protected using the plate-shaped spacer 320. Moreover, the inside of a pocket 208p in the susceptor 208 may become dirty (due to particles, or the like); in this case, use of the plate-shaped spacer 320 makes it possible to cover the dirt in the pocket 208p by means of the spacer bottom portion 320b. Consequently, adhesion of dirt on the surface 11 of the substrate 10 can be suppressed. In this case as well, as in the case with the ring-shaped spacer 310, it is preferred that the plate-shaped spacer 320 have an equivalent outer diameter to the outer diameter of the substrate 10 and that the plate-shaped spacer 320 have a width of around 0.5-5.0 mm in the radial direction of the substrate 10. The height (thickness) of the plate-shaped spacer 320 is, preferably, around 0.5-2 mm.

Note that, at this time, placing the substrate 10 on a flat susceptor 208 via the ring-shaped spacer 310 or the plate-shaped spacer 320 makes it possible to have not only of the reverse surface 12 but also the side surface 13 of the substrate 10 exposed. Accordingly, while protecting the surface 11 of the substrate 10, it is also possible to form the protective layer 20 not only on the reverse surface 12 but also the side surface 13 of the substrate 10.

With such a method, as illustrated in FIG. 4, the protective layer 20 is formed on the reverse surface 12 side and the side surface 13 side of the substrate 10.

At this time, the thickness of the protective layer 20 may be set to 20 nm or more and 1000 nm or less, preferably 50 nm or more and 800 nm or less, for example.

Moreover, at this time, by directly forming the protective layer 20 on the reverse surface 12 side (i.e. rough surface side) of the substrate 10, the protective layer 20 can be formed to be amorphous or polycrystalline. As a result, as described above, the protective layer 20 can be made less prone to cracks.

At this time, when the protective layer 20 is AlN, for example, the protective layer 20 can be formed to be amorphous by setting the protective layer 20 deposition temperature (growth temperature) to 300° C. or more and 600° C. or less. Meanwhile, the protective layer 20 can be formed to be polycrystalline by setting the protective layer 20 deposition temperature to 600° C. or more and 800° C. or less. The protective layer 20 can be formed to be monocrystalline by setting the protective layer 20 growth temperature to 800° C. or more and 1500° C. or less. Note that the protective layer 20 growth temperature is preferably lower than or equal to 1000° C. because then thermal decomposition of the substrate 10 in step 2, for example, can be suppressed.

S160: Semiconductor Layer Formation Step

Next, group III element-containing gas and a nitriding agent are supplied onto the substrate 10 heated to a growth temperature of higher than or equal to 1250° C. so as to epitaxially grow the semiconductor layer 30, including a group III nitride semiconductor, on the surface 11 side of the substrate 10. In this example, the semiconductor layer 30 may be grown into GaN, the same as the substrate 10, for example.

In this embodiment, the semiconductor layer 30 with high purity may be grown by the following method, for example.

First, with reference to FIG. 5 and FIG. 6, the configuration of an HVPE apparatus 200 used for growing a GaN crystal will be described. The HVPE apparatus 200 includes a reaction vessel 203 which may be formed in a cylindrical shape, for example. The reaction vessel 203 has a sealed structure so that atmosphere on the outside of the vessel or gas inside a glovebox 220 (described later) does not enter inside the vessel. A reaction chamber 201 in which the crystal is grown is formed inside the reaction vessel 203. The susceptor 208 for holding the substrate 10 is provided inside the reaction chamber 201. The susceptor 208 is connected to a rotary shaft 215 of a rotary mechanism 216 and is configured to be rotatable. An internal heater 210 is provided inside the susceptor 208. A configuration is adopted in which the temperature of the internal heater 210 can be controlled separately from a zone heater 207 (described later). A heat shield wall 211 covers an area around the susceptor 208 and the upstream side of the susceptor 208. As a result of the heat shield wall 211 being provided, gases other than gas supplied from nozzles 249a-249c (described later) are not supplied to the substrate 10.

The reaction vessel 203 is connected to the glovebox 220 via a metal flange 219 formed from, for example, SUS in a cylindrical shape. The glovebox 220 also has an airproof structure so that atmosphere does not enter the inside of the glovebox. An exchange chamber 202 provided inside the glovebox 220 is continuously purged with high-purity nitrogen (also referred to simply as "N$_2$ gas" below) and is maintained in a state in which oxygen and moisture concentrations have a low value. The glovebox 220 includes a transparent acrylic wall, a plurality of rubber gloves connected to holes passing through the wall, and a passbox for introducing/removing objects inside/outside the glovebox 220. The passbox includes a vacuuming mechanism and a N$_2$ purging mechanism and is configured such that through substitution of the inside atmosphere with N$_2$ gas, introduction/removal of objects inside/outside the glovebox 220 is possible without atmosphere including oxygen being drawn into the glovebox 220. When the crystal substrate is to be introduced/removed into/from the reaction vessel 203, an opening section of the metal flange 219, i.e. opening 221, is opened in order to do so, as illustrated in FIG. 6. This makes it possible to prevent re-contamination of the surfaces of members in the reaction vessel 203 for which purification and modification treatment based on the high-temperature bake step (described later) have been completed, or adhesion of atmosphere and gases containing the various impurities mentioned above on the surfaces of these members.

One end of the reaction vessel 203 receives the connection of a gas supply pipe 232a for supplying hydrogen chloride (HCl) gas in a gas generator 233a (described later), a gas supply pipe 232b for supplying ammonia (NH$_3$) gas in the reaction chamber 201, a gas supply pipe 232c for supplying HCl gas for high-temperature baking and normal baking in the reaction chamber 201, and a gas supply pipe 232d for supplying nitrogen (N$_2$) gas in the reaction chamber 201. The gas supply pipes 232a-232c are configured to be capable of also supplying hydrogen (H$_2$) gas and N$_2$ gas serving as carrier gases in addition to the HCl gas and the NH$_3$ gas. The gas supply pipes 232a-232c each include a flow rate control device and a valve (neither of these are illustrated in the drawings) for each type from among these gases and are configured to be capable of controlling the flow rate of the various types of gases as well as starting/stopping the supply of same for each gas type individually. The gas supply pipe 232d also includes a flow rate control device and a valve (neither of these are illustrated in the drawings). N$_2$ gas supplied from the gas supply pipe 232d is used to purge the area around and the upstream side of the heat shield wall 211 inside the reaction chamber 201 to maintain the degree of purity of the atmosphere at these sites.

The HCl gas supplied from the gas supply pipe 232c and the H$_2$ gas supplied from the gas supply pipes 232a-232c act as a cleaning gas for purifying the surfaces of the members inside the reaction chamber 201 (in particular, the members on the inner side of the heat shield wall 211) and as a modification gas for modifying these surfaces into surfaces that are highly unlikely to emit impurities in the high-temperature bake step and the normal bake step (described later). The N$_2$ gas supplied from the gas supply pipes 232a-232c act so as to appropriately adjust the blow-out flow velocity of HCl gas and H$_2$ gas blowing out from the tip ends of the nozzles 249a-249c so that a desired site in the reaction chamber 201 (in particular, on the inner side of the heat shield wall 211) is appropriately cleaned, for example, in the bake steps.

The HCl gas introduced from the gas supply pipe 232a acts as a reaction gas which acts with Ga material so as to generate GaCl gas that is a halogenated form of Ga, i.e. Ga raw material gas, in the crystal growth step (described later). The NH$_3$ gas supplied from the gas supply pipe 232b acts as a nitriding agent, i.e. N raw material gas, for reacting with GaCl gas so as to grow GaN that is a nitrided form of Ga on the substrate 10 in the crystal growth step (described later). The GaCl gas and the NH$_3$ gas may be collectively referred to as "raw material gas" below. The H$_2$ gas and the N$_2$ gas supplied from the gas supply pipes 232a-232c act so as to appropriately adjust the blow-out flow velocity of the raw material gas blowing out from the tip ends of the nozzles 249a-249c so as to direct the raw material gas to the substrate 10 in the crystal growth step (described later).

As has been described above, the gas generator 233a for storing a Ga melt as a Ga raw material is provided downstream of the gas supply pipe 232a. The gas generator 233a is provided with the nozzle 249a for supplying GaCl gas, generated through a reaction between HCl gas and the Ga melt, toward the main surface of the substrate 10 being held on the susceptor 208. The nozzles 249b, 249c are provided downstream of the gas supply pipes 232b, 232c for supplying the various gases supplied from these gas supply pipes toward the main surface of the substrate 10 being held on the susceptor 208. The nozzles 249a-249c are configured to penetrate through the upstream side of the heat shield wall 211.

The gas supply pipe 232c is configured to be capable of supplying not only HCl gas, $H_2$ gas, and $N_2$ gas, but also, as dopant gas, for example, ferrocene ($Fe(C_5H_5)_2$, abbreviated as $Cp_2Fe$) gas, Fe-containing gas such as iron(III) chloride ($FeCl_3$), Si-containing gas such as silane ($SiH_4$) gas or dichlorosilane ($SiH_2Cl_2$) gas, or Mg-containing gas such as bis(cyclopentadienyl)magnesium ($Mg(C_5H_5)_2$, abbreviated as $Cp_2Mg$) gas.

An evacuation pipe 230 for evacuating the inside of the reaction chamber 201 is provided in the metal flange 219 provided on the other end of the reaction vessel 203. The evacuation pipe 230 is provided with an APC valve 244 and a pump 231, serving as pressure adjustment equipment, from the upstream side in the stated order. It is also possible to use a blower having a pressure adjusting mechanism in place of the APC valve 244 and the pump 231.

The zone heater 207 for heating the inside of the reaction chamber 201 to a desired temperature is provided at the outer periphery of the reaction vessel 203. The zone heater 207 is formed from at least two heaters, one for a site encompassing the gas generator 233a on the upstream side and the other for a site encompassing the susceptor 208 on the downstream side, and each of these heaters has a temperature sensor and a temperature adjustment device (neither of these are illustrated in the drawings) so that each heater can individually adjust the temperature within a range between room temperature and 1200° C.

The susceptor 208 for holding the substrate 10 includes the internal heater 210, a temperature sensor 209, and a temperature adjusting device (not illustrated in the drawings), so as to be capable of adjusting the temperature at least within a range between room temperature and 1600° C. separately from the zone heater 207, as described above. Moreover, as has been described above, the heat shield wall 211 surrounds the area around the susceptor 208 and the upstream side of the susceptor 208. For the surface (inner perimetric surface) of the heat shield wall 211 on the side facing the susceptor 208, at least, a specific member that does not generate impurities needs to be used, as will be described later, but for the other surfaces (outer perimetric surface) thereof, any member that can withstand a temperature of 1600° C. or higher can be used without limitation. The portion of the heat shield wall 211 other than at least the inner perimetric surface may be formed from a non-metallic material with high heat resistance, such as carbon or silicon carbide (SiC), or from a metallic material with high heat resistance, such as Mo or W, and may have a structure in which plate-like reflectors are stacked, for example. Adopting such a configuration makes it possible to limit the temperature on the outside of the heat shield wall 211 to 1200° C. or lower even when the temperature of the susceptor 208 is 1600° C. 1200° C. is no higher than the softening point of quartz, so according to this configuration, quartz can be used for members forming the reaction vessel 203, the gas generator 233a, and the upstream side portions of the gas supply pipes 232a-232d.

The surface of a member defining a region (high-temperature reaction region) 201a of the reaction chamber 201 that may come into contact with gas supplied onto the substrate 10 and that is heated to or above 900° C. when carrying out the crystal growth step (described later) is formed from a material that has heat resistance to at least 1600° C. or higher and does not contain quartz ($SiO_2$) and B. Specifically, the following portions, for example, includes (comprises) a heat resistant material such as alumina ($Al_2O_3$), SiC, graphite, pyrolytic graphite, etc.: the inner wall of the heat shield wall 211 that is upstream of the susceptor 208; portions of the nozzles 249a-249c that are passed through to the inner side of the heat shield wall 211; portions of the nozzles 249a-249c that are located on the outer side of the heat shield wall 211 and are heated to or above 900° C. when carrying out the crystal growth step; and the surface of the susceptor 208. Needless to say, the portions around the internal heater 210, although not included in the region 201a, also need to have heat resistance to at least 1600° C. or higher. The reason for which such high heat resistance is required for the members defining the region 201a, etc., is that the high-temperature bake step is carried out before carrying out the crystal growth step, as will be described later.

The various members included in the HVPE apparatus 200, e.g. the valves and the flow rate control devices of the gas supply pipes 232a-232d, the pump 231, the APC valve 244, the zone heater 207, the internal heater 210, the temperature sensor 209, and so on, are connected to a controller 280 that is formed as a computer.

Next, an example of a process in which the aforementioned HVPE apparatus 200 is used to epitaxially grow a GaN monocrystal on the substrate 10 will be described in detail with reference to FIG. 5 and FIG. 6. Operations of the units forming the HVPE apparatus 200 are controlled by the controller 280 in the description below.

High-Temperature Bake Step

This step is carried out in cases where the inside of the reaction chamber 201 and/or the inside of the exchange chamber 202 is exposed to atmosphere due to maintenance work for the HVPE apparatus 200, introduction of Ga raw material into the gas generator 233a, or other relevant reasons. Before performing this step, it is confirmed whether airtightness of the reaction chamber 201 and the exchange chamber 202 is adequate. After adequacy of airtightness is confirmed, the inside of the reaction chamber 201 and the inside of the exchange chamber 202 are substituted with $N_2$ gas to establish a low-oxygen, low-moisture state in the chambers. After a predetermined atmosphere is created in the reaction vessel 203, in this state, the surfaces of the various members included in the reaction chamber 201 are subjected to heat treatment. This treatment is carried out in a state in which the substrate 10 is not placed in the reaction vessel 203 and a state in which the Ga raw material is introduced in the gas generator 233a.

In this step, the temperature of the zone heater 207 is adjusted to be equivalent to a temperature used in the crystal growth step. Specifically, the temperature of the heater for the upstream side encompassing the gas generator 233a is set to a temperature of 700° C.–900° C., and the temperature of the heater for the downstream side encompassing the susceptor 208 is set to a temperature of 1000° C.–1200° C. The temperature of the internal heater 210 is set to a predetermined temperature that is higher than or equal to 1500° C. As will be described later, in the crystal growth process, the temperature of the internal heater 210 is set to a temperature of 1250° C. or more and 1400° C. or less, so the temperature of the high-temperature reaction region 201a is 900° C. or more and 1400° C. or less. Meanwhile, in the high-temperature bake step, the temperature of the internal heater 210 is set to a temperature of higher than or equal to 1500° C. so that the temperature of the high-temperature reaction region 201a is 1000° C.–1500° C. or higher, and not only the temperatures in the vicinity of the susceptor 208 on which the substrate 10 is placed are raised to a high temperature of higher than or equal to 1500° C., but the temperatures at other locations are all raised to temperatures that are at least higher by 100° C. or more than temperatures during the crystal growth step. Within the high-temperature reaction region 201a, the site at which the temperature during the crystal growth step is lowest (900° C.), specifically the site that is on the inner side of the heat shield wall 211 and corresponds to the upstream side of the nozzles 249a-249c, is where removal of adhering impurity gas is most difficult. Setting the temperature of the internal heater 210 to a temperature of higher than or equal to 1500° C. to raise the temperature at this site to a temperature of at least 1000° C. or higher makes it possible to obtain adequate effects based on the purification and the modification treatment (described later), i.e. the effect that impurities in the grown GaN crystal can be reduced. When the temperature of the internal heater 210 is set to a temperature below 1500° C., there may be a site in the high-temperature reaction region 201a where temperature cannot be adequately raised, and it is difficult to obtain the effects based on the purification and the modification treatment (described later), i.e. the effect that impurities in the GaN crystal can be reduced.

The upper limit of the temperature of the internal heater 210 in this step is dependent on the capability of the heat shield wall 211. In other words, as long as the temperatures of the quartz components, and the like, on the outer side of the heat shield wall 211 is suppressed to a range not exceed the heat resistant temperatures thereof, a higher raise in the temperature of the internal heater 210 facilitates more the achievement of the effects based on the purification and the modification treatment (described later). When the temperatures of the quartz components, and the like, on the outer side of the heat shield wall 211 exceed the heat resistant temperatures thereof, there may be an increase in the maintenance frequency and costs related to the HVPE apparatus 200.

In this step, after the temperatures of the zone heater 207 and the internal heater 210 have reached the aforementioned predetermined temperatures, $H_2$ gas is supplied from each of the gas supply pies 232a, 232b at a flow rate of, for example, around 3 slm. HCl gas and $H_2$ gas are supplied from the gas supply pipe 232c at flow rates of, for example, around 2 slm and around 1 slm, respectively. And $N_2$ gas is supplied from the gas supply pipe 232d at a flow rate of, for example, around 10 slm. This state is maintained for a prescribed amount of time to carry out baking in the reaction chamber 201. As a result of the supply of $H_2$ gas and HCl gas being started at the timing mentioned above, i.e. after the temperature inside the reaction chamber 201 has been raised, the amount of gas wastefully flowing without contributing to the purification and the modification treatment (described later) can be reduced and processing costs involved in crystal growth can be cut.

This step is carried out while the pump 231 is being operated, and at this time, the opening of the APC valve 244 is adjusted in order to maintain the pressure inside the reaction vessel 203 to 0.5 atm or more and 2 atm or less, for example. By carrying out this step while the reaction vessel 203 is being evacuated, removal of impurities from the inside of the reaction vessel 203, i.e. purification of the inside of the reaction vessel 203, can be carried out efficiently. Note that when the pressure inside the reaction vessel 203 is lower than 0.5 atm, the effects based on the purification and the modification treatment (described later) will be more difficult to obtain. When the pressure inside the reaction vessel 203 is higher than 2 atm, etching damage on the members inside the reaction chamber 201 will be excessive.

In this step, the partial pressure ratio of HCl gas to $H_2$ gas (HCl partial pressure/$H_2$ partial pressure) in the reaction vessel 203 may be set to a magnitude of 1/50-1/2, for example. When the partial pressure ratio is smaller than 1/50, the effects based on the purification and the modification treatment (described later) will be more difficult to obtain. When the partial pressure ratio is greater than 1/2, etching damage on the members inside the reaction chamber 201 will be excessive. The partial pressure can be controlled by adjusting the flow rate with the flow rate control devices provided in the gas supply pipes 232a-232c.

By carrying out this step for 30 minutes or more and 300 minutes or less, for example, the surfaces of the members constituting at least the high-temperature reaction region 201a of the reaction chamber 201 are purified, and foreign matter adhering to the surfaces can be removed. Further, by maintaining the surfaces of these members at temperatures that are higher than the temperatures in the crystal growth step (described later) by 100° C. or more, emission of impurity gas from these surfaces can be promoted, and the surfaces can be modified into surfaces that emit impurities such as Si, B, Fe, O, C, etc. less readily under the temperature and pressure conditions in the crystal growth step. When the amount of time for which this step is carried out is smaller than 30 minutes, the aforementioned effects based on the purification and the modification treatment may be inadequate. When the amount of time for which this step is carried out exceeds 300 minutes, damage on the members defining the high-temperature reaction region 201a will be excessive.

When $H_2$ gas and HCl gas are being supplied inside the reaction vessel 203, supply of $NH_3$ gas inside the reaction vessel 203 is inhibited. When $NH_3$ gas is supplied inside the reaction vessel 203 in this step, the aforementioned effects based on the purification and the modification treatment, and in particular, the effect based on the modification treatment, will be more difficult to obtain.

When supplying $H_2$ gas and HCl gas inside the reaction vessel 203, a halogen gas such as chlorine ($Cl_2$) gas may be supplied in place of the HCl gas. In this case as well, the aforementioned effects based on the purification and the modification treatment can similarly be obtained.

When supplying $H_2$ gas and HCl gas inside the reaction vessel 203, $N_2$ gas serving as a carrier gas may be added from the gas supply pipes 232a-232c. By adjusting the blow-out flow velocity of gas from the nozzles 249a-249c through the addition of $N_2$ gas, it is possible to prevent a situation where the aforementioned purification and modification treatment remains incomplete for a certain site. Instead of $N_2$ gas, a rare gas such as Ar gas or He gas may be supplied.

When the aforementioned purification and modification treatment are completed, the output of the zone heater 207 is lowered, and the temperature inside the reaction vessel 203 is lowered to a temperature of, for example, lower than or equal to 200° C., i.e. a temperature at which placement of the substrate 10 in the reaction vessel 203 is possible. Also, supply of $H_2$ gas and HCl gas inside the reaction vessel 203 is stopped and the $N_2$ gas is used to purge the inside of the reaction vessel 203. When purging of the inside of the reaction vessel 203 is completed, the opening of the APC valve 244 is adjusted, while supply of $N_2$ gas inside the reaction vessel 203 is being maintained, such that the pressure inside the reaction vessel 203 is at or slightly above atmospheric pressure.

Normal Bake Step

The aforementioned high-temperature bake step is carried out in cases where the inside of the reaction chamber 201 and/or the inside of the exchange chamber 202 is exposed to atmosphere. When the crystal growth step is to be performed, however, under normal conditions the inside of the reaction chamber 201 and the inside of the exchange chamber 202 would not be exposed to atmosphere before, during, or after the step, so the high-temperature bake step is unnecessary. However, carrying out the crystal growth step results in GaN polycrystals adhering to the surfaces of the nozzles 249a-249c, the surface of the susceptor 208, the inner wall of the heat shield wall 211, and so on. If a subsequent crystal growth step is carried out in the presence of GaN polycrystal remnants, Ga droplets or GaN polycrystal powder scattering as a result of separation from the polycrystal, for example, adhere to the substrate 10 and cause hindrance to satisfactory crystal growth. Thus, the normal bake step is carried out following the crystal growth step in order to remove the aforementioned GaN polycrystals. The processing procedure and the processing conditions of the normal bake step may be equivalent to those of the high-temperature bake step, except that the internal heater 210 is placed in an off state and that the temperature in the vicinity of the susceptor 208 is the same as the temperature in the crystal growth step. Carrying out the normal bake step makes it possible to remove GaN polycrystals from the inside of the reaction chamber 201.

Crystal Growth Step

When the temperature reduction and purging of the inside of the reaction vessel 203 are completed after carrying out the high-temperature bake step or the normal bake step, then as illustrated in FIG. 6, the opening 221 of the reaction vessel 203 is opened and the substrate 10 is placed on the susceptor 208. The opening 221 is connected to the glovebox 220 that is isolated from atmosphere and is continuously purged using $N_2$ gas. The glovebox 220, as has been described above, includes the transparent acrylic wall, the plurality of rubber gloves connected to the holes passing through the wall, and the passbox for introducing/removing objects inside/outside the glovebox 220. Substituting the atmosphere in the passbox with $N_2$ gas makes it possible to introduce/remove objects inside/outside the glovebox 220 without drawing atmosphere into the glovebox 220. By performing the substrate 10 placement work using such a mechanism, re-contamination of the members in the reaction vessel 203 for which purification and modification treatment based on the high-temperature bake step have been completed or re-adhesion of impurity gas to these members can be prevented. The surface of the substrate 10 to be placed on the susceptor 208, i.e. the main surface (crystal growth surface or base surface) thereof on the side facing the nozzles 249a-249c, is set to be, as described above, the (000-1) surface, i.e. -c face (N-polar surface), of the GaN crystal, for example.

When placement of the substrate 10 in the reaction chamber 201 is completed, the opening 221 is closed, and supply of either $H_2$ gas or $H_2$ gas plus $N_2$ gas inside the reaction chamber 201 is started while heating and evacuating the inside of the reaction chamber 201.

In this step, for the purpose of preventing thermal decomposition of the GaN crystal forming the substrate 10, it is preferred to start the supply of $NH_3$ gas from the gas supply pipe 232b into the reaction chamber 201 at or before the time point at which the temperature of the substrate 10 reaches 500° C. Moreover, for the purpose of enhancing uniformity of the semiconductor layer 30 in-plane film thickness, or the like, this step preferably is carried out while the susceptor 208 is kept being rotated.

Then, in a state in which a desired processing temperature and processing pressure have been reached in the reaction chamber 201 and the atmosphere in the reaction chamber 201 has been made into a desired atmosphere, the supply of HCl gas from the gas supply pipe 232a is started and GaCl gas is supplied onto the surface of the substrate 10.

As a result, as illustrated in FIG. 1, a GaN crystal is homoepitaxially grown on the surface 11 of the substrate 10 and the semiconductor layer 30 is formed.

At this time, as a result of the semiconductor layer 30 being epitaxially grown on the surface 11 of the substrate 10 that is formed from an N-polar surface, the semiconductor layer 30 can be grown by an N-polar surface (in a-c axis direction). As a result, the semiconductor layer 30 can be grown in such a way that the semiconductor layer 30 expands so as to have a larger diameter than the substrate 10 as the semiconductor layer 30 grows away from the surface 11 of the substrate 10 in a perpendicular direction.

Moreover, at this time, by virtue of the protective layer 20, thermal decomposition of at least the reverse surface 12 of the substrate 10 can be suppressed, and adherence of Ga droplets on the surface 11 of the substrate due to Ga vapor from the reverse surface 12 of the substrate 10 can be suppressed. As a result, the surface of the semiconductor layer 30 can be made smooth. Specifically, as described above, the RMS of the semiconductor layer 30 can be made to be smaller than or equal to 10 nm, preferably smaller than or equal to 1 nm, for example.

Moreover, at this time, by growing the semiconductor layer 30 in a state in which the protective layer 20 is provided on at least the reverse surface 12 side of the substrate 10, it is possible to grow the semiconductor layer 30 at a temperature that exceeds a critical temperature at which thermal decomposition of the reverse surface 12 of the substrate 10 would start if the protective layer 20 were not provided. Specifically, the semiconductor layer 30 growth temperature can be set to 1250° C. or more and 1400° C. or less, for example. As a result, contamination of the semiconductor layer 30 by impurities can be suppressed and the semiconductor layer 30 can be grown with high purity.

Furthermore, at this time, by growing the semiconductor layer 30 at a growth temperature of higher than or equal to 1250° C. after carrying out the high-temperature bake step in which the surfaces of the members constituting at least the high-temperature reaction region 201a of the reaction chamber 201 are purified and modified, it is possible to grow the semiconductor layer 30 with extremely high purity. Specifically, as described above, the concentration of O in the semiconductor layer 30 and the concentration of C in the semiconductor layer 30 can be made to be lower than $1\times10^{17}$ at/cm$^3$, preferably lower than $1\times10^{16}$ at/cm$^3$, more preferably lower than $5\times10^{15}$ at/cm$^3$, for example. Moreover, the concentration of each of B and Fe in the semiconductor layer 30 can be made to be lower than $1\times10^{15}$ at/cm$^3$, for example. Note that, in this embodiment, since Si doping is not carried out, the concentration of Si in the semiconductor layer 30 can be made to be lower than $1\times10^{17}$ at/cm$^3$, preferably lower than $1\times10^{16}$ at/cm$^3$, more preferably lower than $5\times10^{15}$ at/cm$^3$, for example. The concentrations of other impurities can also be made low, as described above.

Furthermore, at this time, by growing the semiconductor layer 30 in a state in which the protective layer 20 is provided not only on the reverse surface 12 side but also the side surface 13 side of the substrate 10, thermal decomposition of the side surface 13 of the substrate 10 can be suppressed and generation of Ga vapor from the side surface 13 of the substrate 10 can be suppressed. As a result, adhesion of Ga droplets on a side surface of the semiconductor layer 30 during expansion growth due to the generation of Ga vapor from the side surface 13 of the substrate 10 can be suppressed.

Moreover, at this time, by growing the semiconductor layer 30 in a state in which the protective layer 20 is provided on at least the reverse surface 12 side of the substrate 10, the semiconductor layer 30 can be grown stably over a long time. As a result, the thickness of the semiconductor layer 30 can be made large. Specifically, as has been described above, the thickness of the semiconductor layer 30 can be made to be larger than 100 µm, preferably larger than or equal to 1000 µm, for example.

To present details of the temperature setting in this step, with regard to the temperature of the zone heater 207, it is preferred that the temperature of the heater for the upstream side encompassing the gas generator 233a be set to a temperature of 700° C.-900° C., for example, and the temperature of the heater for the downstream side encompassing the susceptor 208 be set to a temperature of 1000° C. or more and 1200° C. or less, for example. It is preferred that the temperature of the internal heater 210 be set to a temperature of 1250° C. or more and 1400° C. or less. Accordingly, the temperature of the susceptor 208 is adjusted to a predetermined growth temperature of 1250° C. or more and 1400° C. or less.

Examples of other processing conditions adopted in this step include the following.

Processing pressure: 0.5-2 atm
GaCl gas partial pressure: 0.1-20 kPa
NH$_3$ gas partial pressure/GaCl gas partial pressure: 1-100
H$_2$ gas partial pressure/GaCl gas partial pressure: 0-100

When supplying GaCl gas and NH$_3$ gas onto the surface of the substrate 10, N$_2$ gas serving as a carrier gas may be added from each of the gas supply pipes 232a-232c. By adjusting the blow-out flow velocity of gas supplied from the nozzles 249a-249c through the addition of N$_2$ gas, it is possible to appropriately control distribution of, for example, the amount of supply of raw material gas on the surface of the substrate 10, and uniform growth speed distribution can be achieved across the entire plane. Instead of N$_2$ gas, a rare gas such as Ar gas or He gas may be supplied.

Removal Step

Once the semiconductor layer 30 having a desired thickness is grown on the substrate 10, then in a state in which the inside of the reaction chamber 201 is evacuated and while NH$_3$ gas and N$_2$ gas are being supplied inside the reaction chamber 201, the supply of HCl gas and H$_2$ gas inside the reaction chamber 201 and the heating by the zone heater 207 are both stopped. Then, when the temperature inside the reaction chamber 201 is lowered to or below 500° C., the supply of NH$_3$ gas is stopped, and the atmosphere in the reaction chamber 201 is substituted with N$_2$ gas to return the pressure to atmospheric pressure. Then, the temperature inside the reaction chamber 201 is lowered to a temperature of, for example, lower than or equal to 200° C., i.e. a temperature at which the substrate 10 on which the semiconductor layer 30 is formed (i.e. the laminate 1) can be removed from the reaction vessel 203. Thereafter, the laminate 1 is removed from the reaction chamber 201 via the glovebox 220 and the passbox.

The laminate 1 in this embodiment is manufactured according to the above process.

S180: Slicing Step

Once the laminate 1 has been removed, as illustrated in FIG. 7, the semiconductor layer 30 within the laminate 1 is sliced parallelly to the growth surface, for example, to produce one or more free-standing substrates 2. This slicing can be carried out using, for example, a wire saw or an electrical discharge machine. At this time, slicing the semiconductor layer 30 having grown expandingly makes it possible to obtain free-standing substrates 2 having a larger diameter than the substrate 10.

Thereafter, a predetermined polishing process is carried out on the surface (-c face, N-polar surface) of the free-standing substrate 2 to make this surface into an epi-ready mirror surface. The reverse surface (+c face, Ga-polar surface) of the free-standing substrate 2 is made into a lapped surface or a mirror surface.

The free-standing substrate 2 in this embodiment is manufactured according to the above process.

It is preferred that the aforementioned high-temperature bake step, normal bake step, crystal growth step, and removal step be carried out in the following order. Namely, given that n is an integer of larger than or equal to 1, the order may preferably be, for example: exposure of the inside of the reaction chamber 201 and/or the inside of the exchange chamber 202 to atmosphere-→high-temperature bake step-→crystal growth step-→removal step-→(normal bake step-→crystal growth step-→removal step)×n.

It should be noted that the substrate 10 which remains after the free-standing substrate 2 has been cut therefrom and on which the protective layer 20 is provided at least on the reverse surface 12 side may be reused to re-grow a semiconductor layer 30 on the surface 11 side of the substrate 10. Accordingly, free-standing substrate 2 manufacturing costs can be cut.

3. Effects Obtained According to this Embodiment

One or more of the effects described hereinbelow can be obtained according to this embodiment.

a. the protective layer 20 having higher heat resistance than the reverse surface 12 of the substrate 10 is formed on the reverse surface 12 formed from a group III element-polar surface within the substrate 10 including a group III nitride semiconductor. Therefore, when the semiconductor layer 30 is grown on the surface 11 formed from an N-polar surface, of the substrate 10 at a growth temperature of higher than or equal to 1250° C., thermal decomposition of at least the reverse surface 12 of the substrate 10 can be suppressed and generation of group III element vapor from the reverse surface 12 of the substrate 10 can be suppressed. Accordingly, adhesion of group III element droplets on the surface 11 of the substrate 10 due to generation of group III element vapor from the reverse surface 12 of the substrate 10 can be suppressed. As a result, the surface of the semiconductor layer 30 can be made smooth even when the growth temperature is higher than or equal to 1250° C.

Moreover, by suppressing the generation of group III element vapor from the reverse surface 12 of the substrate 10, adhesion of group III element droplets on a side surface of the semiconductor layer 30 during expansion growth can be suppressed. As a result, hindrance to the growth of the semiconductor layer 30 in the radial direction can be suppressed, and stable expansion growth of the semiconductor layer 30 is made possible.

Moreover, by suppressing thermal decomposition of the reverse surface 12 of the substrate 10 by means of the protective layer 20, it is possible to prevent a situation where impurities contained in the reverse surface 12 of the substrate 10 reach the surface 11 of the substrate 10 during growth of the semiconductor layer 30. In other words, contamination of the semiconductor layer 30 by impurities originating from the reverse surface 12 of the substrate 10 can be suppressed.

Further, by making it possible to stably grow the semiconductor layer 30 at an extremely high growth temperature of higher than or equal to 1250° C., contamination of the semiconductor layer 30 by impurities can be suppressed and the semiconductor layer 30 can be grown with high purity, even when the semiconductor layer 30 is grown by an N-polar surface. Specifically, the concentration of O in the semiconductor layer 30 and the concentration of C in the semiconductor layer 30 can be made to be lower than $1 \times 10^{17}$ at/cm$^3$ at most, for example.

As has been described above, according to this embodiment, the laminate 1 and the free-standing substrate 2 can both be manufactured with high purity.

b. In this embodiment, prior to the step of epitaxially growing the semiconductor layer 30, the high-temperature bake step is carried out. The high-temperature bake step includes raising a temperature of a high-temperature reaction region 201a to a temperature of 1500° C. or more and supplying hydrogen gas and halogen gas inside a reaction vessel while inhibiting supply of the nitriding agent inside the reaction vessel 203, to purify and modify a surface of a member constituting the high-temperature reaction region 201a. Here, the high-temperature reaction region 201a is at least a region that is heated to the growth temperature in a reaction vessel 203 in which the semiconductor layer 30 is epitaxially grown, and the high-temperature reaction region 201a is not partitioned from a region into which the substrate 10 is loaded, and comes into contact with the gas supplied onto the substrate 10. Thereafter, the semiconductor layer 30 is grown at a growth temperature of higher than or equal to 1250° C. Thus, the semiconductor layer 30 having extremely high purity can be grown. Specifically, the concentration of O in the semiconductor layer 30 and the concentration of C in the semiconductor layer 30 may be made to be lower than $1 \times 10^{17}$ at/cm$^3$, preferably lower than $1 \times 10^{16}$ at/cm$^3$, more preferably lower than $5 \times 10^{15}$ at/cm$^3$, for example.

c. By making the concentration of O in the semiconductor layer 30 be lower than $1 \times 10^{17}$ at/cm$^3$, preferably lower than $1 \times 10^{16}$ at/cm$^3$, more preferably lower than $5 \times 10^{15}$ at/cm$^3$, for example, free electron concentration in the semiconductor layer 30 can be controlled by the concentration of n-type impurities in the semiconductor layer 30, such as Si or Ge, that are easily controllable.

When a semiconductor layer including a group III nitride semiconductor is grown by an N-polar surface using a conventional vapor phase epitaxy apparatus, or the like, unintended contamination of the semiconductor layer by O may occur due to, for example, a member included in the vapor phase epitaxy apparatus. O in a group III nitride semiconductor constitutes an n-type impurity (donor) that generates free electrons. In such a condition in which unintended contamination of the semiconductor layer by O constituting an n-type impurity has occurred, control of free electron concentration in the semiconductor layer is difficult.

In contrast, in this embodiment, the aforementioned manufacturing method is used to reduce to the possible extent the concentration of O, the dosage of which is relatively difficult to control. Thereby, the dosage of n-type impurities in the semiconductor layer 30 can be regulated by the total concentration of Si and Ge, the dosage of which is relatively easy to control. Accordingly, the free electron concentration in the semiconductor layer 30 can be made equivalent to the total concentration of Si and Ge.

To present an example, by making the concentration of each of Si and Ge in the semiconductor layer 30 be lower than $1 \times 10^{17}$ at/cm$^3$, preferably lower than $1 \times 10^{16}$ at/cm$^3$, more preferably lower than $5 \times 10^{15}$ at/cm$^3$, for example, as in this embodiment, free electron concentration in the semiconductor layer 30 can be made to be lower than a predetermined value and insulating properties of the semiconductor layer 30 can be made to be high. As a result, the free-standing substrates 2 obtained from the semiconductor layer 30 can be formed as semi-insulating substrates.

d. By making the concentration of C in the semiconductor layer 30 be lower than $1 \times 10^{17}$ at/cm$^3$, preferably lower than $1 \times 10^{16}$ at/cm$^3$, more preferably lower than $5 \times 10^{15}$ at/cm$^3$, for example, free electron concentration in the semiconductor layer 30 can be controlled by the concentration of n-type impurities alone in the semiconductor layer 30.

In the aforementioned case where a conventional vapor phase epitaxy apparatus, or the like, is used, unintended contamination of the semiconductor layer by C also may occur. C in a group III nitride semiconductor constitutes a p-type impurity (acceptor) and compensates n-type impurities. In such a condition in which unintended contamination of the semiconductor layer by C compensating n-type impurities has occurred, control of free electron concentration in the semiconductor layer is difficult.

In contrast, in this embodiment, the aforementioned manufacturing method is used to reduce to the possible extent the concentration of C compensating n-type impurities. Thereby, free electron concentration in the semiconductor layer 30 can easily be controlled by the concentration of n-type impurities alone in the semiconductor layer 30. That is to say, the free electron concentration in the semiconductor layer 30 can be made equivalent to the concentration of n-type impurities.

e. The free-standing substrate 2 obtained in this embodiment has high purity, as described above, and hence has high insulating properties such that the electrical resistivity thereof under the temperature condition of 20° C. or more and 200° C. or less is higher than or equal to $1 \times 10^6$ Ωcm. If the GaN crystal has a large amount of donor impurities such as Si or O, enhancement of the insulating properties of the crystal may involve the addition of Mn, Fe, cobalt (Co), Ni, copper (Cu), or other such compensating impurities in the crystal, for example. If so, however, the quality of the GaN crystal may become more prone to degradation due to the addition of compensating impurities. For example, when compensating impurities are added in the GaN crystal, free-standing substrates obtained by slicing the crystal will be prone to cracks. Moreover, scattering of compensating impurities in the structure of the stack formed on the substrate results in the characteristics of the semiconductor device produced using this substrate being more prone to degradation. In contrast, with the free-standing substrate 2 in this embodiment, high insulating properties can be obtained without the addition of compensating impurities, so the potential problem relating to crystallinity degradation that lies in many conventional techniques can be avoided.

f. The insulating properties of the free-standing substrate 2 obtained in this embodiment are less temperature-dependent and is more stable compared to insulating properties that are obtained by adding compensating impurities in the crystal. In this regard, it may seem that if Fe is added in a concentration that exceeds the concentration of Si and O, into a GaN crystal containing Si and O in a concentration of higher than or equal to $1 \times 10^{17}$ at/cm$^3$, for example, the GaN crystal can be endowed with insulating property similar to that of the GaN crystal of this embodiment. However, the level of Fe used as a compensating impurity is relatively low, i.e. around 0.6 eV. Accordingly, the insulating properties obtained through the addition of Fe tends to a decrease in response to a temperature increase compared to the insulating properties of the GaN crystal in this embodiment. In contrast, according to this embodiment, since insulating properties can be achieved without the addition of compensating impurities, the potential problem relating to an increase in temperature dependence that lies in many conventional techniques can be avoided.

g. Members at least whose surface includes quartz-free and boron-free material are used as the members constituting at least the aforementioned high-temperature reaction region 201a of the reaction vessel 203. Thus, unintended contamination of the semiconductor layer 30 by Si, O, and B can be suppressed. As a result, the semiconductor layer 30 having extremely high purity can be grown.

When, for example, the members constituting at least the aforementioned high-temperature reaction region 201a of the reaction vessel 203 comprises, for example, SiC, graphite, or other such heat-resistant material containing no O, the concentration of O in the GaN crystal grown on the substrate 10 can be further reduced. Accordingly, quality of the GaN crystal can be further enhanced and the insulating properties thereof can also be further enhanced.

When, for example, the members constituting at least the aforementioned high-temperature reaction region 201a of the reaction vessel 203 comprises, for example, alumina or other such heat-resistant material containing no C, the concentration of C in the GaN crystal grown on the substrate 10 can be further reduced. Accordingly, quality of the GaN crystal can be further enhanced.

h. By growing the semiconductor layer 30 in a state in which the protective layer 20 is provided not only on the reverse surface 12 side but also the side surface 13 side of the substrate 10, thermal decomposition of the side surface 13 of the substrate 10 can be suppressed and generation of Ga vapor from the side surface 13 of the substrate 10 can be suppressed. In this regard, if the protective layer 20 is not provided on the side surface 13 of the substrate 10, Ga droplets may adhere on a side surface of the semiconductor layer 30 during expansion growth due to the generation of Ga vapor from the side surface 13 of the substrate 10. Since the side surface 13 of the substrate 10 is close to the side surface of the expandingly growing semiconductor layer 30, such a phenomenon tends to occur. Accordingly, growth of the semiconductor layer 30 in the radial direction may be hindered. In contrast, in this embodiment, by growing the semiconductor layer 30 in a state in which the protective layer 20 is provided not only on the reverse surface 12 side but also the side surface 13 side of the substrate 10, adhesion of Ga droplets on a side surface of the semiconductor layer 30 during expansion growth due to the generation of Ga vapor from the side surface 13 of the substrate 10 can be suppressed. As a result, hindrance to the growth of the semiconductor layer 30 in the radial direction can be suppressed, and stable expansion growth of the semiconductor layer 30 is made possible.

4. Modifications of this Embodiment

The configuration of this embodiment is not limited to the configuration of the first embodiment above and may be modified as in the modifications presented below.

First Modification

In the first modification, the semiconductor layer 30 grown by an N-polar surface contains Fe, and this feature constitutes a difference to the embodiment above. Specifically, the concentration of each of O and C in the semiconductor layer 30 is lower than $1 \times 10^{17}$ at/cm$^3$, for example. The concentration of each of Si and Ge in the semiconductor layer 30 is lower than $1 \times 10^{17}$ at/cm$^3$, for example. The concentration of B in the semiconductor layer 30 is lower than $1 \times 10^{15}$ at/cm$^3$, for example. Meanwhile, the concentration of Fe in the semiconductor layer 30 is higher than or equal to $1 \times 10^{17}$ at/cm$^3$, for example.

The electrical resistivity of the free-standing substrate 2 obtained from the semiconductor layer 30 under the temperature condition of 20° C. or more and 200° C. or less is, for example, higher than or equal to $1 \times 10^8$ Ω·cm.

According to the first modification, as a result of the concentration of Si, O, etc. as n-type impurities being lowered in the semiconductor layer 30 grown by an N-polar surface, even when the dosage of Fe is kept low, the insulating properties of the semiconductor layer 30 can be enhanced.

Second Modification

In the second modification, the semiconductor layer 30 grown by an N-polar surface is an n-type semiconductor layer, and this feature constitutes a difference to the embodiment above. Specifically, the concentration of each of O and C in the semiconductor layer 30 is lower than $1 \times 10^{17}$ at/cm$^3$, for example. The concentration of each of B and Fe in the semiconductor layer 30 is lower than $1 \times 10^{15}$ at/cm$^3$, for example. Meanwhile, the concentration of Si in the semiconductor layer 30 is higher than or equal to $1 \times 10^{18}$ at/cm$^3$, for example. Note that Ge may be added in place of, or in addition to, Si.

The electrical resistivity of the free-standing substrate 2 obtained from the semiconductor layer 30 under the temperature condition of 20° C. or more and 200° C. or less is, for example, lower than or equal to 100 Ω·cm.

According to the second modification, as a result of the concentration of C, Fe, etc. compensating Si as an n-type impurity being lowered in the semiconductor layer 30 grown by an N-polar surface, even when the dosage of Si is kept low, free electrons can be generated in the semiconductor layer 30 at a desired concentration and desired conductivity can be imparted to the semiconductor layer 30.

Third Modification

In the third modification, the semiconductor layer 30 grown by an N-polar surface is a p-type semiconductor layer, and this feature constitutes a difference to the embodiment above. Specifically, the concentration of each of O and C in the semiconductor layer 30 is lower than $1\times10^{17}$ at/cm$^3$, for example. The concentration of each of Si and Ge in the semiconductor layer 30 is lower than $1\times10^{17}$ at/cm$^3$, for example. The concentration of B and Fe in the semiconductor layer 30 is lower than $1\times10^{15}$ at/cm$^3$, for example. Meanwhile, the concentration of Mg in the semiconductor layer 30 is higher than or equal to $3\times10^{18}$ at/cm$^3$, for example.

The hole concentration in the semiconductor layer 30 is higher than or equal to $2\times10^{17}$ at/cm$^3$, for example.

According to the third modification, as a result of the concentration of Si, O, etc. as n-type impurities being lowered in the semiconductor layer 30 grown by an N-polar surface, even when the dosage of Mg is kept low, holes can be generated in the semiconductor layer 30 at a desired concentration.

Second Embodiment of Present Invention

A second embodiment of the present invention will be described below with reference to the appended drawings. This embodiment differs from the first embodiment above in that a semiconductor device 3 is obtained from a laminate 1. Only the differences to the first embodiment above will be described below.

1. Nitride Semiconductor Laminate

Figure 8:
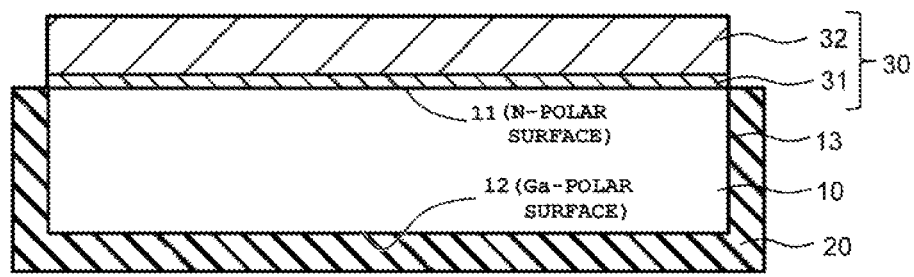
FIG. 8 is a cross-sectional diagram illustrating a nitride semiconductor laminate in a second embodiment of the present invention.

First, a laminate 1 in this embodiment will be described with reference to FIG. 8. FIG. 8 is a cross-sectional diagram illustrating a nitride semiconductor laminate in this embodiment.

As illustrated in FIG. 1, the laminate 1 in this embodiment may be configured as an intermediate material used in the manufacture of a semiconductor device 3 configured as a Schottky barrier diode (SBD) (described later), for example. Specifically, the laminate 1 may include a substrate 10, a protective layer 20, and a semiconductor layer 30, for example.

Substrate

In this embodiment, the substrate 10 may be configured as an n-type GaN free-standing substrate containing an n-type impurity, for example. Examples of the n-type impurity in the substrate 10 include Si or Ge, for example. The concentration of the n-type impurity in the substrate 10 is $1.0\times10^{18}$ at/cm$^3$ or more and $1.0\times10^{19}$ at/cm$^3$ or less, for example.

Similarly to the first embodiment, a surface 11 of the substrate 10 is an N-polar surface, and a reverse surface 12 of the substrate 10 is a Ga-polar surface.

Protective Layer

The protective layer 20 is provided at least on the reverse surface 12 side of the substrate 10 and includes a material having higher heat resistance than the reverse surface 12 of the substrate 10. In this embodiment as well, the protective layer 20 may be provided not only on the reverse surface 12 side of the substrate 10 but also on the side of a side surface 13 of the substrate 10, for example.

Semiconductor Layer

In this embodiment, the semiconductor layer 30 provided on the surface 11 of the substrate 10 formed from an N-polar surface includes an n-type semiconductor base layer 31 and a drift layer 32, for example.

N-Type Semiconductor Base Layer

The n-type semiconductor base layer 31 is provided in contact with the surface 11 of the substrate 10 as a buffer layer which incorporates the crystallinity of the substrate 10 and on which the drift layer 32 is to be epitaxially grown with stability.

The n-type semiconductor base layer 31 is configured as an n-type GaN layer which includes an n-type impurity and in which the amount of impurities other than the n-type impurity is made to be small. In other words, the concentration of each of O and C in the n-type semiconductor base layer 31 is lower than $1\times10^{17}$ at/cm$^3$, for example. The concentration of each of B and Fe in the n-type semiconductor base layer 31 is lower than $1\times10^{15}$ at/cm$^3$, for example. Meanwhile, the concentration of Si in the n-type semiconductor base layer 31 is $1.0\times10^{18}$ at/cm$^3$ or more and $1.0\times10^{19}$ at/cm$^3$ or less, for example. Ge may be added in place of, or in addition to, Si.

The thickness of the n-type semiconductor base layer is smaller than the thickness of the drift layer 32 (described later) and is 0.1 μm or more and 3 μm or less, for example.

Drift Layer

The drift layer 32 is provided on the n-type semiconductor base layer 31 and is configured as an n-type GaN layer which includes an n-type impurity at a low concentration and in which the amount of impurities other than the n-type impurity is made to be small. In other words, the concentration of each of O and C in the drift layer 32 is lower than $1\times10^{16}$ at/cm$^3$, preferably lower than $5\times10^{15}$ at/cm$^3$, for example. The concentration of each of B and Fe in the drift layer 32 is lower than $1\times10^{15}$ at/cm$^3$, for example. Meanwhile, the concentration of Si in the drift layer 32 is lower than the concentration of Si in each of the substrate 10 and the n-type semiconductor base layer 31 and is $1.0\times10^{14}$ at/cm$^3$ or more and $5.0\times10^{16}$ at/cm$^3$ or less, for example. Making the concentration of Si in the drift layer 32 higher than or equal to $1.0\times10^{14}$ at/cm$^3$ makes it possible to reduce the on resistance of the semiconductor device 3. Meanwhile, making the concentration of Si in the drift layer 32 lower than or equal to $5.0\times10^{16}$ at/cm$^3$ makes it possible to ensure a predetermined breakdown voltage of the semiconductor device 3. Ge may be added in place of, or in addition to, Si.

The drift layer 32 is provided so as to be thicker than the n-type semiconductor base layer 31, for example, for the purpose of enhancing the breakdown voltage of the semiconductor device 3. Specifically, the thickness of the drift layer 32 is 3 μm or more and 100 μm or less, for example. Making the thickness of the drift layer 32 larger than or equal to 3 μm makes it possible to ensure a predetermined breakdown voltage of the semiconductor device 3. Meanwhile, making the thickness of the drift layer 32 smaller than or equal to 100 μm makes it possible to reduce the on resistance of the semiconductor device 3.

When the thicknesses of the n-type semiconductor base layer 31 and the drift layer 32 are within the aforementioned ranges, no expansion in the diameter of the semiconductor layer 30 in the laminate 1 can be observed in actuality, as illustrated in FIG. 8. When the semiconductor layer 30 is grown over a long time as in the first embodiment, an increase in the diameter of the semiconductor layer 30 can be observed, as illustrated in FIG. 1. But in this embodiment, since the semiconductor layer 30 has a small thickness, the aforementioned increase in the diameter of the semiconductor layer 30 cannot be observed.

The drift layer 32 may include an implantation region (no corresponding reference symbol illustrated in the drawings) in which an impurity is ion-implanted, for example.

2. Semiconductor Device

Figure 9:
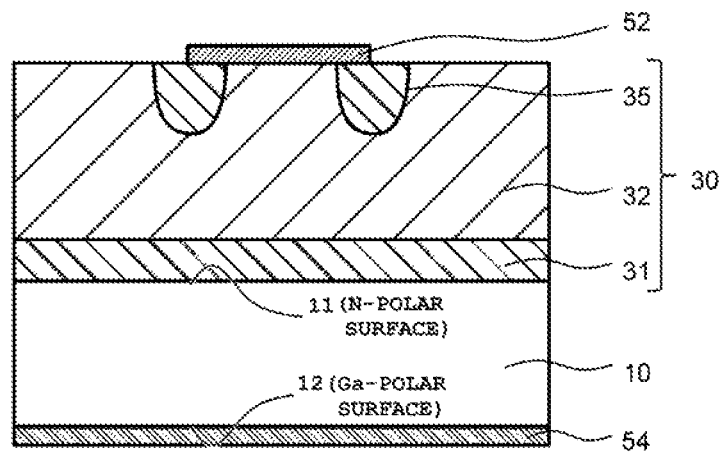
FIG. 9 is a cross-sectional diagram illustrating a semiconductor device in the second embodiment of the present invention.

Next, the semiconductor device 3 in this embodiment will be described using FIG. 9. FIG. 9 is a cross-sectional diagram illustrating the semiconductor device in this embodiment.

As illustrated in FIG. 9, the semiconductor device 3 in this embodiment is configured as an SBD manufactured using the aforementioned laminate 1, and includes the substrate 10, the n-type semiconductor base layer 31, the drift layer 32, an insulating film 40, a p-type electrode (anode) 52, and an n-type electrode (cathode) 54, for example.

The drift layer 32 in this embodiment includes, in at least a portion on the surface side thereof, an impurity implantation region (impurity region, p-type region) 35 in which an impurity is ion-implanted, for example. The impurity implantation region 35 in this embodiment may be formed by ion-implantation of a p-type impurity, for example. Examples of the p-type impurity include Mg. The maximum value of the concentration of the p-type impurity in the impurity implantation region 35 is $1 \times 10^{17}$ at/cm$^3$ or more and $1 \times 10^{20}$ at/cm$^3$ or less, for example, and the depth of the impurity implantation region 35 from the surface of the drift layer 32 may 50 nm or more and 300 nm or less, for example.

The impurity implantation region 35 in this embodiment may be provided in a ring shape, as viewed in a plan view, and may be configured as what is called a "guard ring", for example. As a result of the drift layer 32 including the impurity implantation region 35 serving as a guard ring, concentration of an electric field around the p-type electrode 52 can be suppressed. As a result, the breakdown voltage of the semiconductor device 3 can be enhanced.

The p-type electrode 52 is provided in contact with the surface of the drift layer 32. The p-type electrode 52 is configured to form a Schottky barrier with the drift layer 32 and includes Pd, Pd/Ni, or Ni/Au, for example. The p-type electrode 52 is disposed in such a way that, in a plan view, the outer periphery of the p-type electrode 52 overlaps the impurity implantation region 35 in the drift layer 32.

The n-type electrode 54 is provided on the reverse surface 12 side of the substrate 10. The n-type electrode is configured to establish an ohmic contact with the substrate 10 and includes Ti/Al, for example.

In should be noted that in the semiconductor device 3 status, the protective layer 20 has already been removed.

Figure 10:
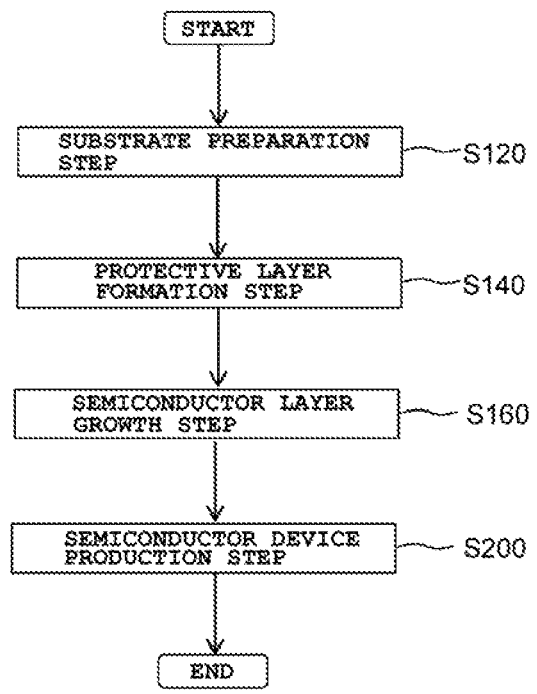
FIG. 10 is a flowchart illustrating a nitride semiconductor laminate manufacturing method or a semiconductor device manufacturing method in the second embodiment of the present invention.
Figure 11A:
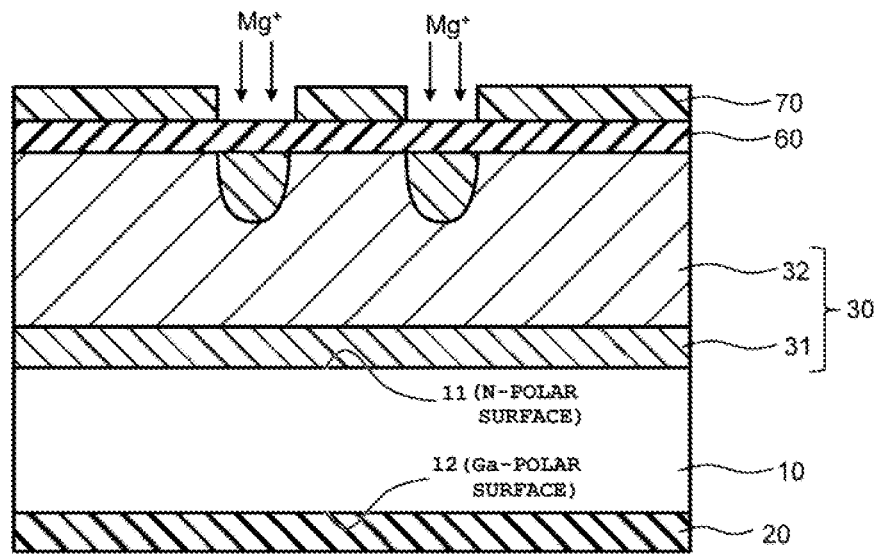
FIG. 11A is a cross-sectional diagram illustrating an ion implantation step and FIG. 11B is a cross-sectional diagram illustrating an activation annealing step.

3. Semiconductor Laminate Manufacturing Method and Semiconductor Device Manufacturing Method Next, a semiconductor laminate manufacturing method and a semiconductor device manufacturing method in this embodiment will be described using FIG. 8 to FIG. 11. FIG. 10 is a flowchart illustrating the nitride semiconductor laminate manufacturing method or the semiconductor device manufacturing method in this embodiment. FIGS. 11 (a) and (b) are cross-sectional diagrams, (a) illustrating an ion implantation step and (b) illustrating an activation annealing step. FIGS. 11 (a) and (b) illustrate part of the laminate 1.

This embodiment describes an example in which the laminate 1 and the semiconductor device 3 are manufactured by carrying out S120-S200 presented below.

S120-S140

The substrate preparation step S120 and the protective layer formation step S140 are carried out similarly to the first embodiment. Through the protective layer formation step S140, the protective layer 20 having higher heat resistance than the reverse surface 12 (formed from a Ga-polar surface) of the substrate 10 is formed at least on the reverse surface 12 side of the substrate 10. In this embodiment as well, the protective layer 20 may be formed not only on the reverse surface 12 side of the substrate 10 but also on the side surface 13 side of the substrate 10, for example.

S160: Semiconductor Layer Formation Step

Next, similarly to the first embodiment, a high-temperature bake step is carried out, in which the surfaces of the members constituting at least the high-temperature reaction region 201a of the reaction chamber 201 are purified and modified, and thereafter GaCl gas and NH$_3$ gas are supplied to the substrate 10 heated to a growth temperature of higher than or equal to 1250° C. Thereby, the semiconductor layer 30 including GaN is epitaxially grown on the surface 11 of the substrate 10 formed from an N-polar surface.

At this time, in this embodiment, the n-type semiconductor base layer 31 and the drift layer 32 is grown in the stated order, for example, as the semiconductor layer 30.

When growing the n-type semiconductor base layer 31, Si-containing gas such as SiH$_4$ gas or SiH$_2$Cl$_2$ is supplied to the substrate 10 concurrently with the supply of GaCl gas and NH$_3$ gas so as to dope Si into the n-type semiconductor base layer 31. The partial pressure ratio of Si-containing gas to GaCl gas (Si-containing gas partial pressure/GaCl gas partial pressure) in the reaction vessel 203 may be set to $1/1 \times 10^4$-$1/1000$, for example. Accordingly, the concentration of Si in the n-type semiconductor base layer 31 is made to be $1.0 \times 10^{18}$ at/cm$^3$ or more and $1.0 \times 10^{19}$ at/cm$^3$ or less, for example.

When growing the drift layer 32, similarly to when growing the n-type semiconductor base layer 31, Si-containing gas is supplied to the substrate 10 so as to dope Si into the drift layer 32. The partial pressure ratio of Si-containing gas to GaCl gas (Si-containing gas partial pressure/GaCl gas partial pressure) in the reaction vessel 203 may be set to $1/1 \times 10^8$-$1/2 \times 10^5$, for example. Accordingly, the concentration of Si in the drift layer 32 is made to be $1.0 \times 10^{14}$ at/cm$^3$ or more and $5.0 \times 10^{16}$ at/cm$^3$ or less, for example.

The laminate 1 in this embodiment is manufactured according to the above process.

S200: Semiconductor Device Production Step

Next, the semiconductor device 3 is produced as follows, using the laminate 1.

Ion Implantation Step

A surface-side cap layer 60 is formed by, for example, sputtering so as to cover the surface of the drift layer 32, the surface-side cap layer 60 including a silicon nitride film (SiNx film) or an AlN film. Accordingly, damage to the drift layer 32 when carrying out ion implantation in the drift layer 32 can be limited. Note that at this time, the thickness of the surface-side cap layer 60 may be set to 20 nm or more and 50 nm or less, for example.

After the surface-side cap layer 60 is formed, a predetermined resist pattern 70 is formed on the surface-side cap layer 60. At this time, in the resist pattern 70, an opening (no corresponding reference symbol illustrated in the drawings) is formed at a location corresponding to the implantation region in the drift layer 32 in a plan view. In this embodiment, the opening of the resist pattern 70 has, for example, a ring shape in a plan view.

After the resist pattern 70 is formed, as illustrated in FIG. 11 (a), a p-type impurity is ion-implanted in the portion of the surface (formed from an N-polar surface) of the drift layer 32 that is exposed through the opening of the resist pattern 70 (i.e. the implantation region in the drift layer 32). In this way, the impurity implantation region 35 containing a p-type impurity is formed in the drift layer 32 (at least in a portion of the surface side of the drift layer 32). In this embodiment, the impurity implantation region 35 is formed as a guard ring having a ring shape in a plan view.

At this time, Mg may be ion-implanted as the p-type impurity, for example. Moreover, at this time, the accelerating voltage when ion-implanting the p-type impurity may be set to 10 keV or more and 100 keV or less, for example, and the dose amount may be set to $1\times10^{12}$ cm$^{-2}$ or more and $1\times10^{15}$ cm$^{-2}$ or less, for example. As a result, the maximum value of the concentration of the p-type impurity in the impurity implantation region 35 is made to be $1\times10^{17}$ at/cm$^3$ or more and $1\times10^{20}$ at/cm$^3$ or less, for example, and the depth of the impurity implantation region 35 from the surface of the drift layer 32 is made to be 50 nm or more and 300 nm or less, for example.

At this time, the state in which the protective layer used in the semiconductor layer growth step S160 is provided at least on the reverse surface 12 side of the substrate 10 is maintained.

When the ion-implantation of the p-type impurity is completed, the resist pattern 70 is removed.

Activation Annealing Step

Figure 11B:
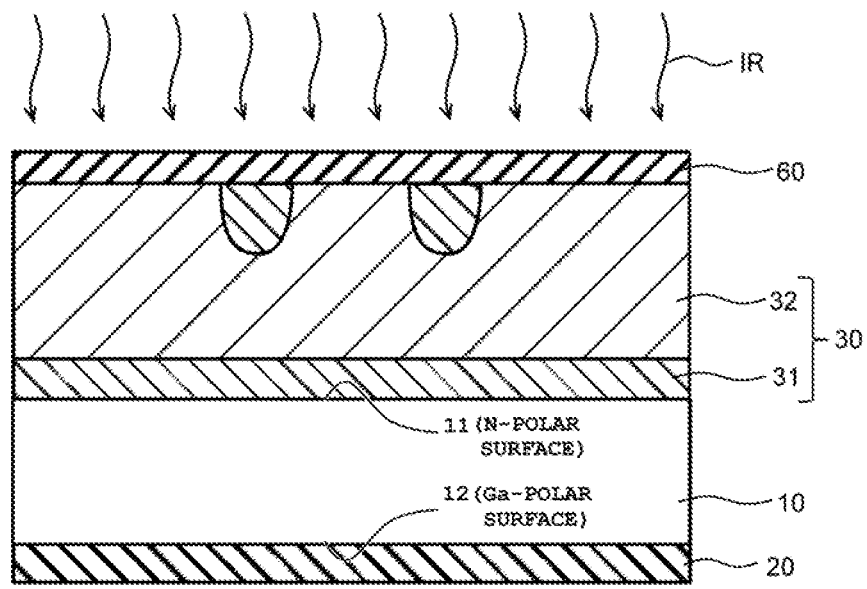

Next, as illustrated in FIG. 11(b), a predetermined heating device (not illustrated in the drawings), for example, is used to irradiate the laminate 1 with at least infrared rays under an inert gas atmosphere, to anneal the laminate 1. Accordingly, the crystal damage which the semiconductor layer 30 received in the ion implantation step is repaired and the p-type impurity in the impurity implantation region is incorporated in the crystal lattice and is (electrically) activated.

At this time, the annealing may be carried out according to a processing procedure and under processing conditions such that, for example, a temperature increase from an initial temperature to an annealing temperature is performed for a period within a range from 3 to 30 seconds, then the annealing temperature is maintained for a period within a range from 20 seconds to 3 minutes, and thereafter a temperature reduction from the annealing temperature to a termination temperature is performed for a period within a range from 1 minutes to 10 minutes. The termination temperature and the initial temperature may each be a temperature within a range of 500° C.-800° C., for example. The annealing temperature may be a temperature within a range of 1100° C. or more and 1250° C. or less, for example. The inert gas atmosphere for the annealing is an atmosphere containing N2 gas or a rare gas such as Ar gas, for example, and the pressure thereof may be set to be a pressure within a range of 100-250 kPa, for example.

At this time, the laminate 1 is annealed in a state in which the surface-side cap layer 60 is provided on the surface 11 side of the substrate 10. Accordingly, thermal decomposition of the surface of the drift layer 32 during the activation annealing step can be suppressed.

At this time, the laminate 1 is annealed in a state in which the protective layer 20 used in the semiconductor layer growth step S160 is provided at least on the reverse surface 12 side of the substrate 10. Accordingly, similarly to the semiconductor layer growth step S160, thermal decomposition of the reverse surface 12 of the substrate 10 can be suppressed by virtue of the protective layer 20.

When the annealing is completed, a predetermined solvent is used to remove the surface-side cap layer 60 and the protective layer 20.

P-Type Electrode Formation Step

Next, a Pd/Ni film is formed by sputtering, for example, so as to cover the surface of the semiconductor layer 30, and the Pd/Ni film is patterned into a predetermined shape by photolithography. Accordingly, the p-type electrode 52 is formed in such a way that the outer periphery of the p-type electrode 52 overlaps the impurity implantation region 35 in a plan view.

N-type Electrode Formation Step

Next, a Ti/Al film is formed by sputtering, for example, on the reverse surface 12 side of the substrate 10, and the Ti/Al film is patterned into a predetermined shape by photolithography. Accordingly, the n-type electrode 54 is formed on the reverse surface 12 side of the substrate 10.

Ohmic Alloy Step

Next, a predetermined heating device (not illustrated in the drawings), for example, is used to irradiate the laminate 1 with at least infrared rays under an inert gas atmosphere, to anneal the laminate 1. Accordingly, the adhesion property of the metal films forming each of the p-type electrode 52 and the n-type electrode 54 are enhanced, and the contact resistance of the p-type electrode 52 in relation to the drift layer 32 and the contact resistance of the n-type electrode 54 in relation to the substrate 10 are reduced.

Thereafter, the laminate 1 is diced and cut into chips having a predetermined size. The chip size may typically be 0.3 mm square or more and 20 mm square or less, and from several chips to several tens of thousands of chips can be obtained from a single laminate 1.

As illustrated in FIG. 9, the semiconductor device 3 in this embodiment is manufactured according to the above process. In the semiconductor device 3, since the impurity implantation region 35 serving as a guard ring is formed on the surface side of the drift layer 32, concentration of an electric field around the p-type electrode 52 can be suppressed. As a result, the breakdown voltage of the semiconductor device 3 can be enhanced.

4. Effects Obtained According to this Embodiment

One or more of the effects described hereinbelow can be obtained according to this embodiment.

a. On the reverse surface 12 formed from a group III element-polar surface within the substrate 10 including a group III nitride semiconductor, the protective layer 20 having higher heat resistance than the reverse surface 12 of the substrate is formed. Thereby, when the semiconductor layer 30 serving as a functional layer of the semiconductor device 3 is grown on the side of the surface 11, formed from an N-polar surface, of the substrate 10 at a growth temperature of higher than or equal to 1250° C., adhesion of Ga droplets on the surface 11 of the substrate 10 due to generation of Ga vapor from the reverse surface 12 of the substrate 10 can be suppressed. Accordingly, the surface of the semiconductor layer 30 can be made smooth even when the growth temperature is higher than or equal to 1250° C. As a result, the breakdown voltage of the semiconductor device 3 can be enhanced.

Further, by making it possible to stably grow the semiconductor layer 30 at an extremely high growth temperature of higher than or equal to 1250° C., contamination of the semiconductor layer 30 by impurities can be suppressed and the semiconductor layer 30 can be grown with high purity, even when the semiconductor layer 30 is grown by an N-polar surface. Specifically, the concentration of O in the semiconductor layer 30 and the concentration of C in the semiconductor layer 30 can be made to be lower than $1\times10^{17}$ at/cm$^3$ at most, for example. Accordingly, the free carrier concentration of the semiconductor layer 30 can be easily controlled.

As has been described above, according to this embodiment, the laminate 1 and the semiconductor device 3 can both be manufactured with high purity.

b. As a result of an impurity being ion-implanted on the surface 11 of the substrate 10 formed from a thermally stable N-polar surface, even when the annealing temperature is higher than or equal to 1100° C. in the activation annealing step, thermal decomposition of the surface 11 of the substrate 10 can be suppressed. Accordingly, the annealing temperature can be raised, or the annealing duration can be prolonged compared to when an impurity is ion-implanted on the group III element-polar surface side of the substrate. As a result, the impurity having been ion-implanted can be reliably activated.

c. Since the concentration of impurities such as O, Si, and C in the semiconductor layer 30 subject to ion implantation is extremely low, even when the amount of p-type impurity such as Mg being implanted is kept low, the hole concentration in the impurity implantation region 35 can be easily controlled and desired conductivity (p-type semiconductor characteristics) can be imparted to the impurity implantation region 35. In other words, it is possible to impart desired semiconductor characteristics while minimizing degradation of crystal quality due to ion implantation of impurities such as Mg compared to conventional GaN crystals containing a larger amount of impurities such as O, Si, and C. In addition, compared to cases where the impurities mentioned above are contained in a larger amount, since the concentration of impurities causing carrier scattering is extremely low, a decrease in carrier mobility can be avoided.

d. In the activation annealing step, the laminate 1 is annealed in the state in which the protective layer 20 used in the semiconductor layer growth step S160 is provided at least on the reverse surface 12 side of the substrate 10. In other words, the protective layer 20 used in the semiconductor layer growth step S160 is used to serve as a reverse surface-side cap layer in the activation annealing step. As a result, in the activation annealing step, similarly to the semiconductor layer growth step S160, thermal decomposition of the reverse surface 12 of the substrate 10 can be suppressed by virtue of the protective layer 20. Moreover, since there is no need to provide a step for forming a reverse surface-side cap layer in the activation annealing step, the manufacturing process can be shortened. As a result, semiconductor device 3 productivity can be enhanced concurrently with an enhancement in semiconductor device 3 quality.

5. Modification of this Embodiment

The configuration of this embodiment is not limited to the configuration of the second embodiment above and may be modified as in the modification presented below.

Figure 12:
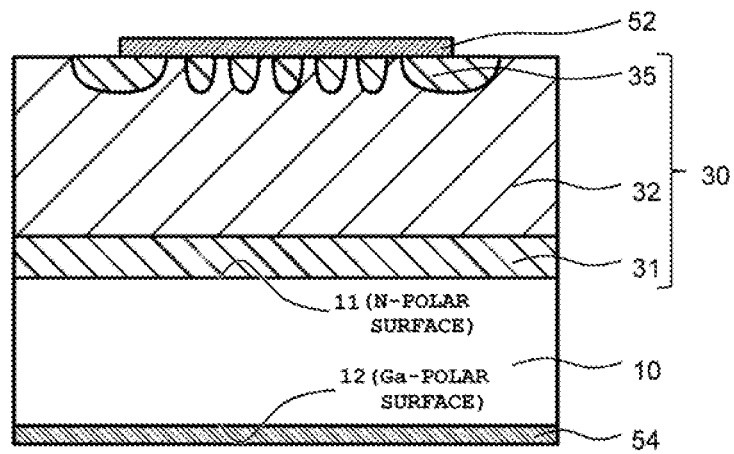
FIG. 12 is a cross-sectional diagram illustrating a semiconductor device in a modification of the second embodiment of the present invention.

FIG. 12 is a cross-sectional diagram illustrating the semiconductor device in a modification of this embodiment. As in the modification illustrated in FIG. 12, the semiconductor device 3 may be formed as what is called a "junction barrier Schottky (JBS) diode".

In this modification, the pattern of the impurity implantation region 35 including a p-type impurity differs from the pattern of the impurity implantation region 35 in the embodiment above. That is, a portion of the region on the inner side from the outer periphery in the impurity implantation region 35 in this modification is located so as to overlap the p-type electrode 52 in a plan view. Specifically, the impurity implantation region 35 may include, for example, a plurality of annular patterns (no corresponding reference symbol illustrated in the drawings) that are disposed concentrically at predetermined intervals from one another in a plan view. Accordingly, a Schottky junction (no corresponding reference symbol illustrated in the drawings) where the drift layer 32 and the p-type electrode 52 are directly joined and a p-n junction (no corresponding reference symbol illustrated in the drawings) where the drift layer 32 and the p-type electrode 52 are joined via the impurity implantation region 35 containing a p-type impurity are formed. The pattern of the impurity implantation region 35 may be other than the above and may be in the form of stripes, for example.

According to this modification, a depletion layer can be formed at the p-n junction with the interposed impurity implantation region 35 containing a p-type impurity. Accordingly, while making the forward characteristics of the semiconductor device 3 equivalent to the characteristics of the SBD as in the embodiment above, the breakdown voltage of the semiconductor device 3 in the reverse bias can be made to be higher than the breakdown voltage of the SBD.

Other Embodiments

Specific embodiments of the present invention have been described above, but the present invention is not limited the embodiments described above and may be modified in a variety of ways as long as the spirit of the invention is maintained.

The embodiments above describe a case where the substrate 10 is a GaN free-standing substrate; however, as long as the substrate includes (comprises) a group III nitride semiconductor, use of GaN is not limiting. In other words, the substrate may include any group III nitride semiconductor that is expressed by the composition formula $Al_xIn_yGa_{1-x-y}N$ ($0 \leq x+y \leq 1$, $0 \leq x \leq 1$, $0 \leq y \leq 1$). Note that when the substrate includes AlN, the protective layer is to include a different material from AlN, preferably $Al_2O_3$ or BN, for example.

The embodiments above describe a case where the semiconductor layer 30 includes (comprises) GaN; however, as long as the semiconductor layer includes (comprises) a group III nitride semiconductor, use of GaN is not limiting. In other words, the semiconductor layer may include any group III nitride semiconductor that is expressed by the compositional formula $Al_xIn_yGa_{1-x-y}N$ ($0 \leq x+y \leq 1$, $0 \leq x \leq 1$, $0 \leq y \leq 1$).

The embodiments above describe a case where the semiconductor layer 30 includes (comprises) the same material (GaN) as the substrate 10; however, as long as the semiconductor layer includes (comprises) the aforementioned group III nitride semiconductor, the semiconductor layer may include a different material from that of the substrate.

The embodiments above describe a case where the protective layer 20 is provided not only on the reverse surface 12 side but also the side surface 13 side of the substrate 10: however, the protective layer may be provided only on the reverse surface side of the substrate.

The embodiments above describe a case where, in step 2, the substrate 10 is placed on the susceptor 208 via the ring-shaped spacer 310 or the plate-shaped spacer 320; however, as long as the surface 11 side of the substrate 10 can be protected, the ring-shaped spacer 310 and the plate-shaped spacer 320 may not be used. For example, a groove having a slightly smaller area than the area of the surface 11 of the substrate 10 may be formed in the pocket 208p of the susceptor 208, and the substrate 10 may be placed on the susceptor 208 in such a way that the surface 11 side of the substrate 10 covers the groove. In this way, the surface 11 side of the substrate 10 can be protected.

The second embodiment above describes a case where the impurity implantation region 35 is formed by ion-implanting a p-type impurity; however, the impurity implantation region may be formed by ion-implanting an n-type impurity or other types of impurities.

EXAMPLES

Various experiment results that support the effects of the present invention will be described below.

1. Nitride Semiconductor Laminate Manufacture

Each of the following nitride semiconductor laminate samples were manufactured in a predetermined quantity.

Example

Substrate: GaN
Substrate surface: N-polar surface
Protective layer: AlN
Protective layer formation method: HVPE
Protective layer thickness: 300 nm
Protective layer formation site: reverse surface side and side surface side of substrate
Semiconductor layer: GaN
Semiconductor layer manufacturing apparatus: HVPE apparatus of above embodiments
Semiconductor layer thickness: 1000 μm
Semiconductor layer growth temperature: 1250° C.

Comparative Example

Substrate: GaN
Substrate surface: N-polar surface
Protective layer: none
Semiconductor layer: GaN
Semiconductor layer manufacturing apparatus: conventional HVPE apparatus
Semiconductor layer thickness: 1000 μm
Semiconductor layer growth temperature: 1250° C.

2. Evaluation

After growth of the semiconductor layer, the semiconductor layer surface morphology was observed by, for example, optical microscopy. In addition, SIMS was carried out to analyze the composition of the semiconductor layer.

3. Results

Comparative Example

In the laminate of the Comparative Example, the surface of the semiconductor layer was rough. It is presumed that, in the Comparative Example, when the semiconductor layer was grown at 1250° C., Ga vapor generated due to thermal decomposition of the reverse surface of the substrate reached the surface of the substrate, and Ga droplets adhered to the surface of the substrate. This is thought to have hindered the growth of the semiconductor layer on the substrate, resulting in the surface of the semiconductor layer being rough.

Further, in the laminate of the Comparative Example, the peripheral shape of the semiconductor layer was warped. It is presumed that, in the Comparative Example, due to the generation of Ga vapor from the reverse surface of the substrate, Ga droplets adhered to the side surface of the semiconductor layer during expansion growth. This is thought to have hindered the growth of the semiconductor layer in the radial direction, resulting in the circumferential shape of the semiconductor layer being warped.

In the laminate of the Comparative Example, the concentrations of the impurities in the semiconductor layer were as follows.

O: $3.5 \times 10^{18}$ at/cm$^3$
C: $2.3 \times 10^{17}$ at/cm$^3$
Si: $4.2 \times 10^{17}$ at/cm$^3$
B: $1.7 \times 10^{16}$ at/cm$^3$
Fe: $1.9 \times 10^{16}$ at/cm$^3$ It is presumed that, in the Comparative Example, when the semiconductor layer was grown at 1250° C., the impurities contained in the reverse surface of the substrate reached the surface of the substrate due to thermal decomposition of the reverse surface of the substrate, and the impurities contaminated the semiconductor layer; moreover, it is presumed that, in the Comparative Example, when the semiconductor layer was grown at 1250° C., the members constituting, for example, the reaction vessel of the HVPE apparatus became the cause of contamination of the semiconductor layer by the impurities. This is thought to have resulted in the high concentrations of the impurities in the semiconductor layer.

Example

In contrast, in the laminate of the Example, the surface of the semiconductor layer was smooth and demonstrated a morphology of a mirror surface. It was confirmed that, in the Example, since the protective layer was formed on side of the reverse surface of the substrate formed from a Ga-polar surface, when the semiconductor layer was grown at 1250° C., thermal decomposition of the reverse surface of the substrate could be suppressed and generation of Ga vapor from the reverse surface of the substrate could be suppressed. It was confirmed that, accordingly, adherence of Ga droplets on the surface of the substrate due to generation of Ga vapor from the reverse surface of the substrate could be suppressed. It was confirmed that, as a result, the surface of the semiconductor layer could be made smooth even when the growth temperature was higher than or equal to 1250° C.

Further, in the laminate of the Example, the semiconductor layer grew expandingly and the semiconductor layer assumed the shape of an inverted truncated cone. It was confirmed that, in the Example, since generation of Ga vapor from the reverse surface of the substrate was suppressed, adherence of Ga droplets to the side surface of the semiconductor layer during expansion growth could be limited. It was confirmed that, consequently, hindrance to the growth of the semiconductor layer in the radial direction could be suppressed, making stable expansion grown of the semiconductor layer possible.

In the laminate of the Example, the concentrations of the impurities in the semiconductor layer were as follows.

O: $7.2 \times 10^{15}$ at/cm$^3$
C: $3.6 \times 10^{15}$ at/cm$^3$
Si: $4.3 \times 10^{15}$ at/cm$^3$
B: lower than $1 \times 10^{15}$ at/cm$^3$ (lower than lower limit of detection for SIMS)
Fe: lower than $1 \times 10^{15}$ at/cm$^3$ (lower than lower limit of detection for SIMS)

It was confirmed that, in the Example, when the semiconductor layer was grown at 1250° C., stable growth of the semiconductor layer at an extremely high growth temperature of higher than or equal to 1250° C. was possible, and even when the semiconductor layer was grown by an N-polar surface, contamination of the semiconductor layer by impurities could be suppressed and the semiconductor layer could be grown with high purity. Moreover, it was confirmed that, in the Example, since the HVPE apparatus of the above embodiments was used and the semiconductor layer was grown after the high-temperature bake step was carried out, the semiconductor layer with extremely high purity could be grown.

As has been described above, it was confirmed that, according to the Example, a nitride semiconductor laminate can be manufactured with high purity.

Preferable Modes of Present Invention

Preferable modes of the present invention will be appended below.

Appendix 1

A nitride semiconductor laminate including:
a substrate comprising a group III nitride semiconductor and including a surface and a reverse surface, the surface being formed from a nitrogen-polar surface, the reverse surface being formed from a group III element-polar surface, the reverse surface being provided on the reverse side from the surface;
a protective layer provided at least on the reverse surface side of the substrate and having higher heat resistance than the reverse surface of the substrate; and
a semiconductor layer provided on the surface side of the substrate and comprising a group III nitride semiconductor, wherein
concentration of O in the semiconductor layer is lower than $1 \times 10^{17}$ at/cm$^3$.

Appendix 2

The nitride semiconductor laminate of Appendix 1, wherein
the concentration of O in the semiconductor layer is lower than $1 \times 10^{16}$ at/cm$^3$.

Appendix 3

The nitride semiconductor laminate of Appendix 1, wherein
the concentration of O in the semiconductor layer is lower than $5 \times 10^{15}$ at/cm$^3$.

Appendix 4

The nitride semiconductor laminate of any one of Appendices 1 to 3, wherein
concentration of C in the semiconductor layer is lower than $1 \times 10^{17}$ at/cm$^3$.

Appendix 5

The nitride semiconductor laminate of Appendix 4, wherein
the concentration of C in the semiconductor layer is lower than $1 \times 10^{16}$ at/cm$^3$.

Appendix 6

The nitride semiconductor laminate of Appendix 4, wherein
the concentration of C in the semiconductor layer is lower than $5 \times 10^{15}$ at/cm$^3$.

Appendix 7

The nitride semiconductor laminate of any one of Appendices 1 to 6, wherein
concentration of each of B and Fe in the semiconductor layer is lower than $1 \times 10^{15}$ at/cm$^3$.

Appendix 8

The nitride semiconductor laminate of any one of Appendices 1 to 7, wherein
thermal decomposition rate of the protective layer is lower than thermal decomposition rate of the reverse surface of the substrate, when heating is carried out at a temperature of 1250° C. or more.

Appendix 9

The nitride semiconductor laminate of any one of Appendices 1 to 8, wherein
the protective layer is also provided on a side of a side surface of the substrate.

Appendix 10

The nitride semiconductor laminate of any one of Appendices 1 to 9, wherein
the thickness of the protective layer is 20 nm or more and 1000 nm or less.

Appendix 11

The nitride semiconductor laminate of any one of Appendices 1 to 10, wherein
the protective layer comprises aluminum nitride, aluminum oxide, or boron nitride.

Appendix 12

The nitride semiconductor laminate of any one of Appendices 1 to 11, wherein
the protection layer is amorphous or polycrystalline.

Appendix 13

The nitride semiconductor laminate of any one of Appendices 1 to 11, wherein
the protective layer is monocrystalline.

Appendix 14

A semiconductor device including:
a substrate comprising a group III nitride semiconductor and including a surface and a reverse surface, the surface being formed from a nitrogen-polar surface, the reverse surface being formed from a group III element-polar surface, the reverse surface being provided on the reverse side from the surface; and
a semiconductor layer provided on the surface side of the substrate and comprising a group III nitride semiconductor, wherein
concentration of O in the semiconductor layer is lower than $1 \times 10^{17}$ at/cm$^3$.

Appendix 15

The semiconductor device of claim 14, wherein
the concentration of O in the semiconductor layer is lower than $1 \times 10^{16}$ at/cm$^3$.

Appendix 16

The semiconductor device of Appendix 14, wherein
the concentration of O in the semiconductor layer is lower than $5 \times 10^{15}$ at/cm$^3$.

Appendix 17

The semiconductor device of any one of Appendices 14 to 16, wherein
concentration of C in the semiconductor layer is lower than $1 \times 10^{17}$ at/cm$^3$.

Appendix 18

The semiconductor device of Appendix 17, wherein
the concentration of C in the semiconductor layer is lower than $1 \times 10^{16}$ at/cm$^3$.

Appendix 19

The semiconductor device of Appendix 17, wherein
the concentration of C in the semiconductor layer is lower than $5 \times 10^{15}$ at/cm$^3$.

Appendix 20

The semiconductor device of any one of Appendices 14 to 19, wherein
concentration of each of B and Fe in the semiconductor layer is lower than $1 \times 10^{15}$ at/cm$^3$.

Appendix 21

The semiconductor device of any one of Appendices 14 to 20, wherein
the semiconductor layer includes an implantation region in which an impurity is implanted.

Appendix 22

A nitride semiconductor laminate manufacturing method including:
preparing a substrate comprising a group III nitride semiconductor and including a surface and a reverse surface, the surface being formed from a nitrogen-polar surface, the reverse surface being formed from a group III element-polar surface, the reverse surface being provided on the reverse side from the surface;
forming a protective layer at least on the reverse surface side of the substrate, the protective layer having higher heat resistance than the reverse surface of the substrate; and
epitaxially growing a semiconductor layer on the surface side of the substrate by supplying group III element-containing gas and a nitriding agent onto the substrate heated to a growth temperature of 1250° C. or more, the semiconductor layer comprising a group III nitride semiconductor, wherein
in the epitaxially growth of the semiconductor layer, concentration of O in the semiconductor layer is made to be lower than $1 \times 10^{17}$ at/cm$^3$.

Appendix 23

The nitride semiconductor laminate manufacturing method of Appendix 22, further including a high-temperature bake step to be carried out prior to the epitaxially growth of the semiconductor layer,
wherein the high-temperature bake step includes:
raising a temperature of a high-temperature reaction region to a temperature of 1500° C. or more and supplying hydrogen gas and halogen gas inside a reaction vessel while inhibiting supply of the nitriding agent inside the reaction vessel, to purify and modify a surface of a member constituting the high-temperature reaction region,
wherein the high-temperature reaction region is at least a region that is heated to the growth temperature in a reaction vessel in which the semiconductor layer is epitaxially grown, and
the high-temperature reaction region is not partitioned from a region into which the substrate is loaded, and comes into contact with the gas supplied onto the substrate.

Appendix 24

The nitride semiconductor laminate manufacturing method of Appendix 23, wherein a member at least whose surface comprises a quartz-free and boron-free material is used as a member constituting a high temperature region.

Appendix 25

The nitride semiconductor laminate manufacturing method of Appendix 24, wherein a member at least whose surface comprising at least any one of alumina, silicon carbide, and graphite is used as the member constituting the high temperature region.

Appendix 26

The nitride semiconductor laminate manufacturing method of any one of Appendices 23 to 25, wherein the method involves the following.
In the high-temperature bake,
pressure in the reaction vessel is maintained to be 0.5 atm or more and 2 atm or less.

Moreover, preferably, in the high-temperature bake,
the temperature of at least the high-temperature reaction region of the reaction vessel is maintained at a temperature of 1500° C. or more.

Moreover, preferably, the high-temperature bake is carried out while the inside of the reaction vessel is being evacuated.

Moreover, preferably, the high-temperature bake step is carried out for 30 minutes or more.

Appendix 27

A nitride semiconductor free-standing substrate manufacturing method including:
preparing a substrate comprising a group III nitride semiconductor and including a surface and a reverse surface, the surface being formed from a nitrogen-polar surface, the reverse surface being formed from a group III element-polar surface, the reverse surface being provided on the reverse side from the surface;
forming a protective layer at least on the reverse surface side of the substrate, the protective layer having higher heat resistance than the reverse surface of the substrate;
epitaxially growing a semiconductor layer on the surface side of the substrate by supplying group III element-containing gas and a nitriding agent onto the substrate heated to a growth temperature of 1250° C. or more, the semiconductor layer comprising a group III nitride semiconductor; and
producing a nitride semiconductor free-standing substrate by cutting the semiconductor layer, wherein
in the epitaxially growth of the semiconductor layer,
concentration of O in the semiconductor layer is made to be lower than $1\times10^{17}$ at/cm$^3$.

Appendix 28

A semiconductor device manufacturing method including:
preparing a substrate comprising a group III nitride semiconductor and including a surface and a reverse surface, the surface being formed from a nitrogen-polar surface, the reverse surface being formed from a group III element-polar surface, the reverse surface being provided on the reverse side from the surface;
forming a protective layer at least on the reverse surface side of the substrate, the protective layer having higher heat resistance than the reverse surface of the substrate; and
epitaxially growing a semiconductor layer on the surface side of the substrate by supplying group III element-containing gas and a nitriding agent onto the substrate heated to a growth temperature of 1250° C. or more, the semiconductor layer comprising a group III nitride semiconductor, wherein
in the epitaxially growth of the semiconductor layer,
concentration of O in the semiconductor layer is made to be lower than $1\times10^{17}$ at/cm$^3$.

Appendix 29

The semiconductor device manufacturing method of Appendix 28, further including:
ion-implanting an impurity in the semiconductor layer; and
activating the impurity in the semiconductor layer by heating the substrate, wherein the activation of the impurity is carried out in a state in which the protective layer used in the epitaxially growth of the semiconductor layer is provided at least on the reverse surface side of the substrate.

REFERENCE SIGNS LIST

1: nitride semiconductor laminate (stack)
2: nitride semiconductor free-standing substrate (free-standing substrate)
3: semiconductor device
10: substrate
20: protective layer
30: semiconductor layer

The invention claimed is:

1. A nitride semiconductor laminate comprising:
a substrate comprising a group III nitride semiconductor and including a surface and a reverse surface, the surface being formed from a nitrogen-polar surface, the reverse surface being formed from a group III element-polar surface, the reverse surface being provided on the reverse side from the surface;
a protective layer provided at least on the reverse surface side of the substrate and having higher heat resistance than the reverse surface of the substrate; and
a semiconductor layer provided on the surface side of the substrate and comprising a group III nitride semiconductor, wherein
concentration of O in the semiconductor layer is lower than $1\times10^{17}$ at/cm$^3$.

2. The nitride semiconductor laminate of claim 1, wherein the concentration of O in the semiconductor layer is lower than $1\times10^{16}$ at/cm$^3$.

3. The nitride semiconductor laminate of claim 1, wherein the concentration of O in the semiconductor layer is lower than $5\times10^{15}$ at/cm$^3$.

4. The nitride semiconductor laminate of claim 1, wherein concentration of C in the semiconductor layer is lower than $1\times10^{17}$ at/cm$^3$.

5. The nitride semiconductor laminate of claim 4, wherein the concentration of C in the semiconductor layer is lower than $1\times10^{16}$ at/cm$^3$.

6. The nitride semiconductor laminate of claim 4, wherein the concentration of C in the semiconductor layer is lower than $5\times10^{15}$ at/cm$^3$.

7. The nitride semiconductor laminate of claim 1, wherein concentration of each of B and Fe in the semiconductor layer is lower than $1\times10^{15}$ at/cm$^3$.

8. The nitride semiconductor laminate of claim 1, wherein the protective layer is also provided on a side of a side surface of the substrate.

9. A semiconductor device comprising:
a substrate comprising a group III nitride semiconductor and including a surface and a reverse surface, the surface being formed from a nitrogen-polar surface, the reverse surface being formed from a group III element-polar surface, the reverse surface being provided on the reverse side from the surface, and
a semiconductor layer provided on the surface side of the substrate and comprising a group III nitride semiconductor, wherein
concentration of O in the semiconductor layer is lower than $1\times10^{17}$ at/cm$^3$.

10. The semiconductor device of claim 9, wherein the concentration of O in the semiconductor layer is lower than $1\times10^{16}$ at/cm$^3$.

11. The semiconductor device of claim 9, wherein the concentration of O in the semiconductor layer is lower than $5 \times 10^{15}$ at/cm$^3$.

12. The semiconductor device of claim 9, wherein concentration of C in the semiconductor layer is lower than $1 \times 10^{17}$ at/cm$^3$.

13. The semiconductor device of claim 12, wherein the concentration of C in the semiconductor layer is lower than $1 \times 10^{16}$ at/cm$^3$.

14. The semiconductor device of claim 12, wherein the concentration of C in the semiconductor layer is lower than $5 \times 10^{15}$ at/cm$^3$.

15. The semiconductor device of claim 9, wherein concentration of each of B and Fe in the semiconductor layer is lower than $1 \times 10^{15}$ at/cm$^3$.

16. The semiconductor device of claim 9, wherein the semiconductor layer includes an implantation region in which an impurity is implanted.

* * * * *